United States Patent
Shang

(10) Patent No.: US 11,894,048 B2
(45) Date of Patent: Feb. 6, 2024

(54) CONTROL AMPLIFYING CIRCUIT, SENSE AMPLIFIER AND SEMICONDUCTOR MEMORY

(71) Applicant: CHANGXIN MEMORY TECHNOLOGIES, INC., Hefei (CN)

(72) Inventor: Weibing Shang, Anhui (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 121 days.

(21) Appl. No.: 17/807,135

(22) Filed: Jun. 15, 2022

(65) Prior Publication Data
US 2023/0223071 A1    Jul. 13, 2023

Related U.S. Application Data

(63) Continuation of application No. PCT/CN2022/079726, filed on Mar. 8, 2022.

(30) Foreign Application Priority Data

Dec. 31, 2021   (CN) .......................... 202111657770.X

(51) Int. Cl.
*G11C 11/40* (2006.01)
*G11C 11/4091* (2006.01)
(Continued)

(52) U.S. Cl.
CPC ...... *G11C 11/4091* (2013.01); *G11C 11/4074* (2013.01); *G11C 11/4094* (2013.01); *G11C 7/12* (2013.01)

(58) Field of Classification Search
None
See application file for complete search history.

(56) References Cited

U.S. PATENT DOCUMENTS 5,396,465 A    3/1995 Oh
5,506,524 A    4/1996 Lin
(Continued)

FOREIGN PATENT DOCUMENTS

CN    101562042 A    10/2009
CN    104078078 A    10/2014
(Continued)

OTHER PUBLICATIONS

First Office Action of the Taiwanese application No. 111127066, dated Aug. 28, 2023. 6 pages with English abstract.
(Continued)

*Primary Examiner* — Tan T. Nguyen
(74) *Attorney, Agent, or Firm* — Syncoda LLC; Feng Ma

(57) ABSTRACT

A control amplifying circuit includes a power supply output circuit, an isolation control circuit and an amplifying circuit. The power supply output circuit is configured to receive a power supply switching signal, and select one preset voltage value from at least two preset voltage values according to the power supply switching signal to output as a preset power supply signal. The isolation control circuit is configured to receive a control command signal and the preset power supply signal, and generate an isolation control signal according to the control command signal. The amplifying circuit is configured to receive the isolation control signal and a signal to be processed, and amplify the signal to be processed based on the isolation control signal to obtain a target amplified signal.

20 Claims, 12 Drawing Sheets

(51) Int. Cl.
*G11C 11/4094* (2006.01)
*G11C 11/4074* (2006.01)
*G11C 7/12* (2006.01)

(56) References Cited

U.S. PATENT DOCUMENTS

| | | | |
|---|---|---|---|
| 6,147,925 | A | 11/2000 | Tomishima |
| 6,614,702 | B2 | 9/2003 | Lee |
| 7,102,947 | B2 | 9/2006 | Kajitani |
| 2003/0043668 | A1 | 3/2003 | Wickman |
| 2006/0023535 | A1 | 2/2006 | Chun |
| 2008/0151664 | A1 | 6/2008 | Kim |
| 2009/0051406 | A1* | 2/2009 | Kawasaki ........ G01R 31/31721 327/419 |
| 2014/0077884 | A1 | 3/2014 | Huynh |
| 2016/0197587 | A1 | 7/2016 | Arknaes-Pedersen |
| 2019/0392873 | A1 | 12/2019 | Kuroda |
| 2020/0099353 | A1 | 3/2020 | Danyuk et al. |
| 2022/0028446 | A1 | 1/2022 | Peng et al. |
| 2022/0270653 | A1* | 8/2022 | Cao ................ G11C 7/08 |

FOREIGN PATENT DOCUMENTS

| | | |
|---|---|---|
| CN | 105763162 A | 7/2016 |
| CN | 110729000 A | 1/2020 |
| CN | 111179983 A | 5/2020 |
| CN | 111863049 A | 10/2020 |
| CN | 111863051 A | 10/2020 |
| CN | 112712837 A | 4/2021 |
| CN | 112767975 A | 5/2021 |
| JP | H11273346 A | 10/1999 |
| TW | I222641 B | 10/2004 |

OTHER PUBLICATIONS

International Search Report in the international application No. PCT/CN2022/079726, dated Sep. 26, 2022. 5 pages with English translation.
International Search Report in the international application No. PCT/CN2022/079712, dated Aug. 25, 2022. 5 pages with English translation.
International Search Report in the international application No. PCT/CN2022/079701, dated Oct. 8, 2022. 6 pages with English translation.

* cited by examiner

CONTROL AMPLIFYING CIRCUIT, SENSE AMPLIFIER AND SEMICONDUCTOR MEMORY

CROSS-REFERENCE TO RELEVANT APPLICATIONS

This is a continuation application of International Patent Application No. PCT/CN2022/079726 filed on Mar. 8, 2022, which claims priority to Chinese patent application No. 202111657770.X filed on Dec. 31, 2021. The disclosures of these applications are hereby incorporated by reference in their entirety.

BACKGROUND

Dynamic Random Access Memory (DRAM) is a semiconductor memory device commonly used in computers and consists of many repeating memory cells. In a process of data reading, a readout data signal of each memory cell is read out via a local data line, a global data line and a data bus in turn; and conversely, in a process of data writing, a write data signal is sequentially written into the memory cell via the data bus, the global data line, and the local data line.

At present, the DRAM includes a sense amplifier for signal amplification processing, but in some implementations, the sense amplifier has a slow amplification speed and readily produce noise.

SUMMARY

The present disclosure relates to the technical field of semiconductor memory, and provides a control amplifying circuit, a sense amplifier and a semiconductor memory, which can improve the problems that the signal amplification speed is slow and noise is easily generated.

According to a first aspect, the embodiments of the present disclosure provide a control amplifying circuit, which includes a power supply output circuit, an isolation control circuit and an amplifying circuit.

The power supply output circuit is configured to receive a power supply switching signal, and select one of at least two preset voltage values according to the power supply switching signal to output as a preset power supply signal.

The isolation control circuit is configured to receive a control command signal and the preset power supply signal, and generate an isolation control signal according to the control command signal.

The amplifying circuit is configured to receive the isolation control signal and a signal to be processed, and amplify the signal to be processed based on the isolation control signal to obtain a target amplified signal.

According to a second aspect, the embodiments of the present disclosure provide a control method for an amplifying circuit, which is applied to an amplifying circuit connected to a target detection unit and includes the following operations.

When the amplifying circuit is in a first amplification phase, a power supply output circuit selects a second voltage value to output as a preset power supply signal according to a power supply switching signal, an isolation control circuit generates an isolation control signal with the second voltage value according to a control command signal in a second state, and the amplifying circuit receives the isolation control signal and a signal to be processed and performs preliminary amplification on the signal to be processed.

When the amplifying circuit is in an evolution phase, the power supply output circuit selects a first voltage value to output as the preset power supply signal according to the power supply switching signal, the isolation control circuit generates an isolation control signal with the first voltage value according to the control command signal in the second state, and the amplifying circuit performs secondary amplification on the signal to be processed according to the isolation control signal.

According to a third aspect, the embodiments of the present disclosure provide a sense amplifier including the control amplifying circuit according to any one of the first aspects.

According to a fourth aspect, the embodiments of the present disclosure provide a semiconductor memory including the sense amplifier according to any one of the third aspects.

The embodiment of the present disclosure provides a control amplifying circuit, a sense amplifier and a semiconductor memory. The control amplifying circuit includes a power supply output circuit, an isolation control circuit and an amplifying circuit. The power supply output circuit is configured to receive a power supply switching signal, and select one of at least two preset voltage values according to the power supply switching signal to output as a preset power supply signal. The isolation control circuit is configured to receive a control command signal and the preset power supply signal, and generate an isolation control signal according to the control command signal. The amplifying circuit is configured to receive the isolation control signal and a signal to be processed, and amplify the signal to be processed based on the isolation control signal to obtain a target amplified signal. In this way, a voltage value of the preset power supply signal can be adjusted by using the power supply switching signal, and then a voltage value of the isolation control circuit is adjusted, so as to optimize the signal amplification process and partially improve the problems that the signal amplification speed is slow and noise is easily generated.

DETAILED DESCRIPTION

The technical solutions in the embodiments of the present disclosure will be clearly and completely described below in conjunction with the accompanying drawings in the embodiments of the present disclosure. It is to be understood that the specific embodiments described herein are merely intended to explain the relevant application and not to limit the application. It should also be noted that, for ease of description, only portions related to the related application are shown in the accompanying drawings.

Unless otherwise defined, all technical and scientific terms used herein have the same meaning as those generally understood by those skilled in the art belonging to the present disclosure. The terms used herein are only adopted to describe the embodiments of the disclosure and not intended to limit the disclosure.

In the following description, "some embodiments" involved describes a subset of all possible embodiments, but it is to be understood that "some embodiments" may be a same subset or different subsets of all possible embodiments and may be combined with each other without conflict.

It should be noted that the term "first\second\third" involved in the embodiments of the present disclosure is merely used to distinguish similar objects without representing a specific order for the objects. It is to be understood that "first\second\third" may be interchanged to specific sequences or orders if allowed to implement the embodiments of the disclosure described herein in sequences except the illustrated or described ones.

The following is explanation of technical terms involved in the embodiments of the present disclosure and a correspondence of partial terms.

P-type FET: hole-type FET;
N-type FET: electron type FET.

Figure 1:
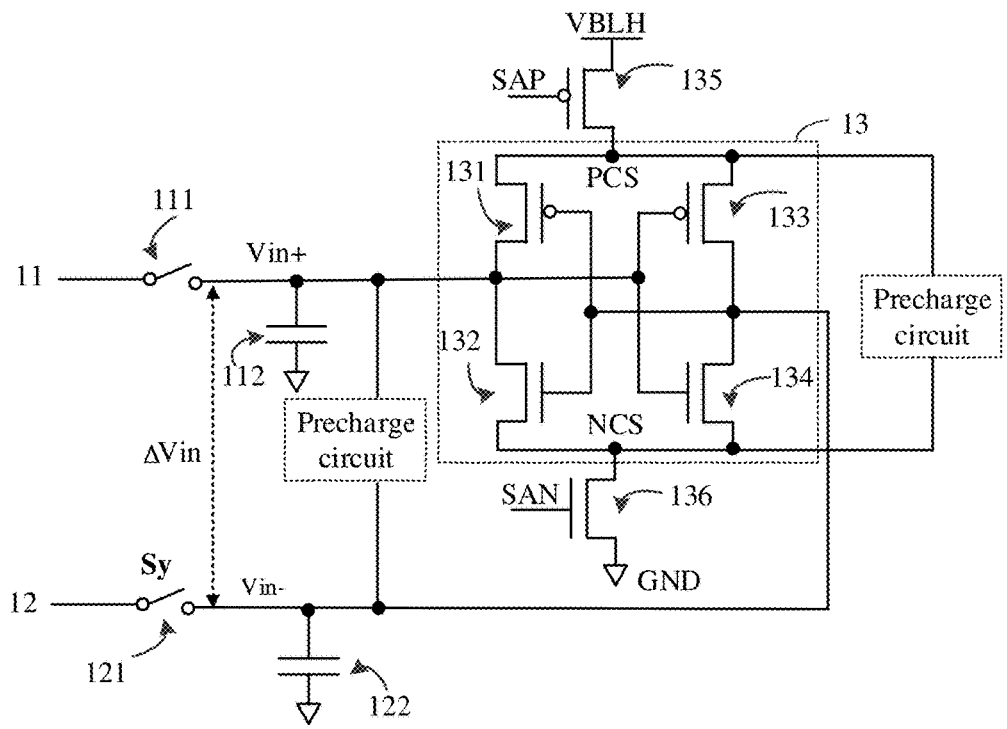
FIG. 1 is a schematic diagram of an application scenario of a sense amplifier.

It is to be appreciated that in the working process of DRAM, it is necessary to use the sense amplifier to realize signal amplification in various operation processes. FIG. 1 illustrates a schematic diagram of an application scenario of a sense amplifier. The application scenario includes a first signal line 11, a second signal line 12 and a sense amplifier 13.

The first signal line 11 is provided with a first switch 111 and a first capacitor 112 for inputting a signal to be processed Vin+. The second signal line 12 is provided with a second switch 121 and a second capacitor 122 for inputting a reference signal to be processed Vin−, and the sense amplifier 13 is used for amplifying the signal to be processed Vin+ and the reference signal to be processed Vin−. A voltage difference between the signal to be processed Vin+ and the reference signal to be processed Vin− is Δ Vin. The first switch 111 and the first capacitor 112 may be regarded as one memory cell, and the second switch 121 and the second capacitor 122 may be regarded as another memory cell.

Specifically, the sense amplifier includes a first switching transistor 131, a second switching transistor 132, a third switching transistor 133 and a fourth switching transistor 134. A first end of the first switching transistor 131, a first end of the second switching transistor 132, a third end of the third switching transistor 133 and a second end of the fourth switching transistor 134 are all connected with the reference signal to be processed Vin−, and a third end of the first switching transistor 131, a second end of the second switching transistor 132, a first end of the third switching transistor 133 and a first end of the fourth switching transistor 134 are all connected with the signal to be processed Vin+. In this application scenario, there are also a fifth switching transistor 135 and a sixth switching transistor 136. A first end of the fifth switching transistor 135 is connected with a first control signal SAP, a second end of the fifth switching transistor 135 is connected with a power supply signal VBLH, and a third end of the fifth switching transistor 135 and a second end of the first switching transistor 131 are connected with a second end of the third switching transistor 133 to form a first reference signal end. A first end of the sixth switching transistor 136 is connected with a second control signal SAN, a third end of the sixth switching transistor 136 is connected with a ground signal GND, and the second end of the sixth switching transistor 136 and the third end of the second switching transistor 132 are connected with a third end of the fourth switching transistor 134 to form a second reference signal end. The first switching transistor 131, the third switching transistor 133 and the fifth switching transistor 135 are P-type FETs, a first end of the P-type FET is a gate pin, a second end of the P-type FET is a source pin, and a third end of the P-type FET is a drain pin. The second switching transistor 132, the fourth switching transistor 134 and the sixth switching transistor 136 are N-type FETs, a first end of the N-type FET is a gate pin, a second end of the N-type FET is a drain pin, and a third end of the N-type FET is a source pin.

In addition, there may be a precharge circuit between the first signal line 11 and the second signal line 12, and there may be a precharge circuit between the second end of the third switching transistor 133 and the third end of the fourth switching transistor for precharging the first reference signal end and the second reference signal end.

At present, the signal amplification speed of the sense amplifier is slow, the circuit is easy to generate noise, and the power consumption is high, which affect the performance of the semiconductor memory.

The embodiments of the present disclosure provide a control amplifying circuit, which includes a power supply output circuit, an isolation control circuit and an amplifying circuit. The power supply output circuit is configured to receive a power supply switching signal, and select one preset voltage value from at least two preset voltage values according to the power supply switching signal to output as a preset power supply signal. The isolation control circuit is configured to receive a control command signal and the preset power supply signal, and generate an isolation control signal according to the control command signal. The amplifying circuit is configured to receive the isolation control signal and a signal to be processed, and amplify the signal to be processed based on the isolation control signal to obtain a target amplified signal. In this way, a voltage value of the preset power supply signal can be adjusted by using the power supply switching signal, and then a voltage value of the isolation control signal is adjusted, so as to optimize the signal amplification process and improve the problems that the signal amplification speed is slow and noise is easily generated.

The embodiments of the present disclosure will be described in detail with reference to the accompanying drawings.

Figure 2:
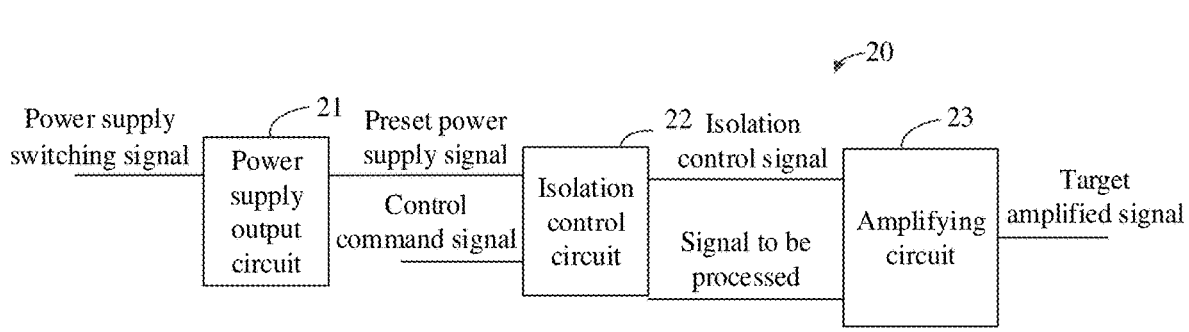
FIG. 2 is a schematic structural diagram of a control amplifying circuit according to an embodiment of the present disclosure.

In an embodiment of the present disclosure, reference is made to FIG. 2, which shows a schematic structural diagram of a control amplifying circuit 20 according to the embodiment of the present disclosure. As shown in FIG. 2, the control amplifying circuit 20 may include a power supply output circuit 21, an isolation control circuit 22 and an amplifying circuit 23.

The power supply output circuit 21 is configured to receive a power supply switching signal, and select one preset voltage value from at least two preset voltage values according to the power supply switching signal to output as a preset power supply signal.

The isolation control circuit 22 is configured to receive a control command signal and the preset power supply signal, and generate an isolation control signal according to the control command signal.

The amplifying circuit 23 is configured to receive the isolation control signal and a signal to be processed, and amplify the signal to be processed based on the isolation control signal to obtain a target amplified signal.

It should be noted that the control amplifying circuit 20 provided in the embodiment of the present disclosure may be applied in a variety of signal amplification scenarios, for example, in a sense amplifier in a DRAM.

The control amplifying circuit 20 provided in the embodiment of the present disclosure receives the power supply switching signal, the control command signal and the signal to be processed from the outside, completes the amplification process of the signal to be processed based on the power supply switching signal and the control command signal, and finally obtains the target amplified signal. Both the control command signal and the power supply switching signal need to be determined according to a specific operation stage of the amplifying circuit.

Specifically, for the control amplifying circuit 20, at least two preset voltage values are selected and outputted by the power supply output circuit 21 according to the power supply switching signal to obtain the preset power supply signal; the isolation control signal is outputted by the isolation control circuit 22 according to the control command signal and the preset power supply signal; and the signal to be processed is amplified by the amplifying circuit 23 according to the isolation control signal to output the target amplified signal.

In this way, a voltage value of the preset power supply signal can be adjusted by using the power supply switching signal, and then a voltage value of the isolation control signal output by the isolation control circuit 22 is adjusted, so as to optimize the signal amplification process and solve the problems that the signal amplification speed is slow and noise is easily generated.

Figure 3:
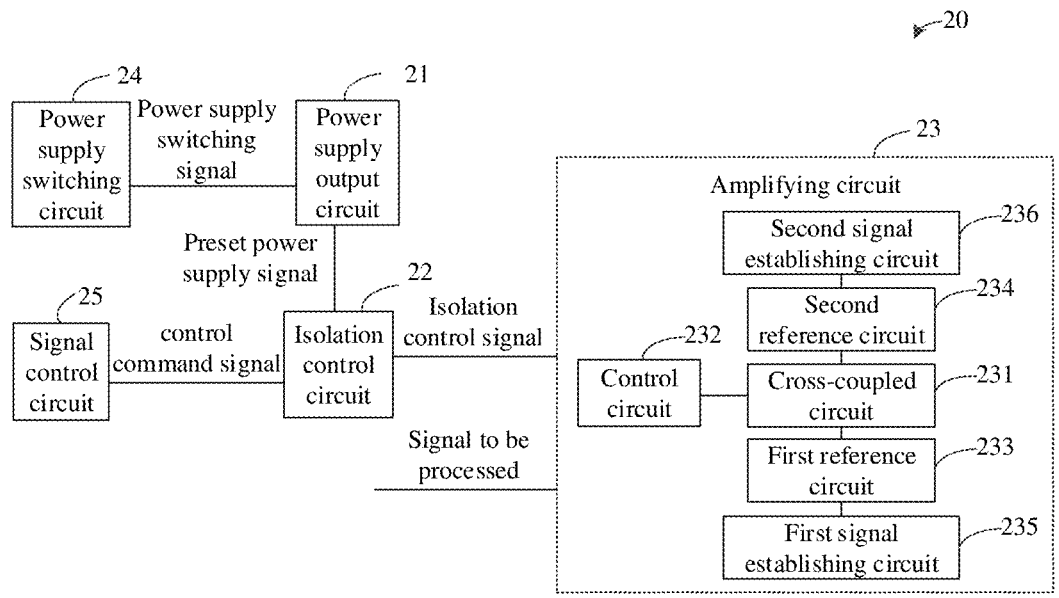
FIG. 3 is a schematic structural diagram of another control amplifying circuit according to an embodiment of the present disclosure.

In some embodiments, the power supply switching signal may include a first power supply switching signal and/or a second power supply switching signal. On the basis of FIG. 2, as shown in FIG. 3, the control amplifying circuit 20 may further include a power supply switching circuit 24.

The power supply switching circuit 24 is configured to output the first power supply switching signal and/or the second power supply switching signal.

The power supply output circuit 21 is specifically configured to receive the first power supply switching signal and/or the second power supply switching signal, and select one preset voltage value from the at least two preset voltage values according to the first power supply switching signal and/or the second power supply switching signal to output as the preset power supply signal.

It should be noted that the power supply switching signal may include only one signal, for example, the first power supply switching signal or second power supply switching signal. Alternatively, the power supply switching signal may include a pair of signals having opposite level states, for example, including both the first power supply switching signal and a second power supply switching signal.

In one specific embodiment, two preset voltage values are set as a first voltage value and a second voltage value. The power supply switching signal includes both of the first power supply switching signal and the second power supply switching signal. In such case, the power supply output circuit 21 is further configured to generate a preset power supply signal having the first voltage value when the first power supply switching signal is in a first level state and the second power supply switching signal is in a second level state; or generate a preset power signal having the second voltage value when the first power supply switching signal is in the second level state and the second power supply switching signal is in the first level state.

The first voltage value and the second voltage value both belong to the second level state, and the first voltage value is greater than the second voltage value.

It should be noted that, for the P-type FET, the first level state may enable the P-type FET to be in an on-state, and the second level state may enable the P-type FET to be in an off-state. For the N-type FET, the first level state may enable the N-type FET to be in an off-state and the second level state may enable the N-type FET to be in an on-state. The first level states of different switching transistors may be different voltage ranges since different switching transistors have different specifications.

In another specific embodiment, the power supply switching signal includes only the first power supply switching signal. In such case, the power supply output circuit 21 is further configured to generate a preset power supply signal having the first voltage value when the first power supply switching signal is in the first level state; or generate a preset power supply signal having the second voltage value when the first power supply switching signal is in the second level state.

In this way, the power supply output circuit 21 may output two preset power supply signals with different voltage values, rather than one power supply signal with a fixed voltage value. In this way, in different operation stages of the amplifying circuit 23, more control means can be provided by adjusting the voltage values of the preset power supply signals, so as to partially solve the problems that the signal amplifying speed is slow and the circuit has a high noise.

In some embodiments, as shown in FIG. 3, the control amplifying circuit 20 may further include a signal control circuit 25.

The signal control circuit 25 is configured to output the control command signal.

The isolation control circuit 22 is further configured to generate an isolation control signal with a third voltage value when the control command signal is in a first state; or generate an isolation control signal with a same voltage value as the preset power supply signal when the control command signal is in a second state.

The first state is the first level state and the second state is the second level state. Alternatively, the first state is the second level state and the second state is the first level state.

It should be noted that, for the isolation control circuit 22, if the control command signal is in the first level state and the preset power supply signal has the first voltage value, the isolation control signal has the first voltage value. If the control command signal is in the first level state and the preset power supply signal has the second voltage value, the isolation control signal has the second voltage value. If the control command signal is in the first state, the isolation control signal has the third voltage value.

Alternatively, if the control command signal is in the second level state and the preset power supply signal has the first voltage value, the isolation control signal has the first voltage value. If the control command signal is in the second level state and the preset power supply signal has the second voltage value, the isolation control signal has the second voltage value. If the control command signal is in the first state, the isolation control signal has the third voltage value.

The third voltage value belongs to the first level state, the first voltage value and the second voltage value both belong to the second level state, the third voltage value is lower than the second voltage value, and the second voltage value is lower than the first voltage value.

Exemplarily, in a customary representation, the first level state may be represented by a logic "0", the second level state may be represented by a logic "1", the third voltage value may be represented by a logic "0", and both the first voltage value and the second voltage value may be represented by logic "1". the above is merely illustrative and does not have actual limitations.

In this way, the isolation control signal has three different voltage values, which can provide more control means to optimize the signal amplification process and partially solve the problems that the signal amplification speed is slow and the circuit noise is high.

Taking the power supply switching signal including both the first power supply switching signal and the second power supply switching signal as an example, a feasible structure of the power supply output circuit 21 is provided.

Figure 4:
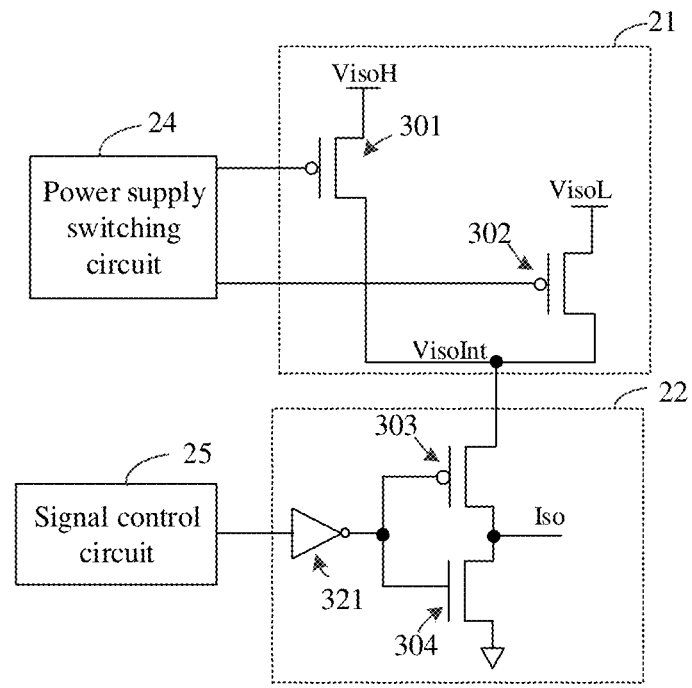
FIG. 4 is a partial detailed structural diagram of a control amplifying circuit according to an embodiment of the present disclosure.

On the basis of FIG. 3, as shown in FIG. 4, the power supply output circuit 21 includes a first preset power supply VisoH, a second preset power supply VisoL, a first switching transistor 301 and a second switching transistor 302.

A first end of the first switching transistor 301 is connected with the first power supply switching signal, and a first end of the second switching transistor 302 is connected with the second power supply switching signal.

A second end of the first switching transistor 301 is connected with the first preset power supply VisoH, and a second end of the second switching transistor 302 is connected with the second preset power supply VisoL.

A third end of the first switching transistor 301 is connected with a third end of the second switching transistor 302 for outputting the preset power supply signal VisoInt.

The first preset power supply VisoH is configured to output the first voltage value, and the second preset power supply VisoL is configured to output the second voltage value.

It should be noted that, as shown in FIG. 4, the first switching transistor 301 and the second switching transistor 302 both are P-type FETs. In the following description, a first end of the P-type FET is a gate pin, a second end of the P-type FET is a source pin, and a third end of the P-type FET is a drain pin.

It should be noted that when the first power supply switching signal is in the first level state and the second power supply switching signal is in the second level state, the first switching transistor 301 is turned on and the second switching transistor 302 is turned off, so the voltage values of the preset power supply signal VisoInt and the first preset power supply VisoH are the same, that is, the preset power supply signal VisoInt has the first voltage value. When the first power supply switching signal is in the second level state and the second power supply switching signal is in the first level state, the first switching transistor 301 is turned off and the second switching transistor 302 is turned on, so the voltage values of the preset power supply signal VisoInt and the second preset power supply VisoL are the same, that is, the preset power supply signal VisoInt has the second voltage value.

In this way, in the embodiments of the present disclosure, on the premise that the isolation control signal Iso is in the second level state, the isolation control signal Iso may be controlled to be a higher voltage (the first voltage value) or a lower voltage (the second voltage value) to suit the voltage requirements and the signal transmission speed at different amplification stages, thereby optimizing the signal amplification process, improving the signal amplification speed and reducing the circuit noise.

Taking the first state being the first level state and the second state being the second level state as an example, a feasible structure of the isolation control circuit 22 is provided. In some embodiments, as illustrated in FIG. 4, the isolation control circuit 22 includes a first inverter 321, a third switching transistor 303 and a fourth switching transistor 304.

An input end of the first inverter 321 is connected with an output end of the signal control circuit 25 for receiving the control command signal output by the signal control circuit 25. An output end of the first inverter 321 is respectively connected with a first end of the third switching transistor 303 and a first end of the fourth switching transistor 304.

A second end of the third switching transistor 303 is connected with the preset power supply signal VisoInt, and a third end of the fourth switching transistor 304 is connected with a ground signal.

A third end of the third switching transistor 303 is connected with a second end of the fourth switching transistor 304 for outputting the isolation control signal Iso.

It should be noted that the third switching transistor 303 is a P-type FET, and the fourth switching transistor 304 is an N-type FET. In the following description, a first end of the N-type FET is a gate pin, a second end of the N-type FET is a drain pin, and a third end of the N-type FET' is a source pin.

In this way, when the control command signal is in the first level state, the third switching transistor 303 is in the off-state and the fourth switching transistor 304 is in the on-state, so that the isolation control signal Iso has the third voltage value corresponding to the ground potential. When the control command signal is in the second level state, the third switching transistor 303 is in the on-state and the fourth switching transistor 304 is in the off-state, so that the voltage value of the isolation control signal Iso is the same as the voltage value of the preset power supply signal VisoInt, i.e., the voltage value of the isolation control signal is the first voltage value or the second voltage value.

In addition, when the first state is the second level state and the second state is the first level state, the isolation control circuit 22 may include only the third switching transistor 303 and the fourth switching transistor 304. The output end of the signal control circuit 25 is connected with the first end of the third switch transistor 303 and the first end of the fourth switch transistor 304, and the other connections remain unchanged.

In such case, when the control command signal is in the second level state, the third switching transistor 303 is in the off-state and the fourth switching transistor 304 is in the on-state, so that the isolation control signal Iso has the third voltage value corresponding to the ground potential. When the control command signal is in the first level state, the third switching transistor 303 is in the on-state and the fourth switching transistor 304 is in the off-state, so that the voltage value of the isolation control signal Iso is the same as the voltage value of the preset power supply signal VisoInt, i.e., the voltage value of the isolation control signal is the first voltage value or the second voltage value.

In some embodiments, as shown in FIG. 3, the amplifying circuit 23 includes a cross-coupled circuit 231 and a control circuit 232.

The amplifying circuit 23 is further configured to receive the signal to be processed through the cross-coupled circuit 231, receive the isolation control signal through the control circuit 232, and amplify the signal to be processed according to the isolation control signal to obtain the target amplified signal.

It should be note that, taking DRAM as an example, the cross-coupled circuit 231 is connected with a target detection unit through a bit line and connected with a complementary memory cell through a complementary bit line. In the initial state, the potentials on the bit line and the complementary bit line are the same. After the memory cell on the bit line (i.e., the target detection unit) is turned on, the memory cell performs charge sharing with the bit line, so that the potential on the bit line rises or drops. The memory cells on the complementary bit line are always turned off, and therefore the potential on the complementary bit line remains unchanged. Since the potential on the bit line rises and drops, the voltage difference between the bit line and the complementary bit line changes, so that a part of devices in the cross-coupled circuit 231 are turned on, and the signal amplification process is performed. In such case, the signal received by the cross-coupled circuit 231 from the bit line may be regarded as the signal to be processed, and the signal received by the cross-coupled circuit 231 from the complementary bit line may be regarded as the reference signal to be processed.

It should also be noted that the cross-coupled circuit 231 further includes a readout bit line connected with one set of switching transistors and a complementary readout bit line connected with another set of switching transistors. When the control circuit 22 controls the isolation control signal to be in the first level state, the bit line and the readout bit line are not connected, and the complementary bit line and the complementary readout bit line are not connected. When the isolation control signal is in the first level state, the control circuit 22 can control the bit line and the readout bit line to be connected, and the complementary bit line and the complementary readout bit line to be connected. Then, the cross-coupled circuit 231 may complete the signal amplification process by means of the readout bit line/complementary readout bit line, as described below.

Figure 5:
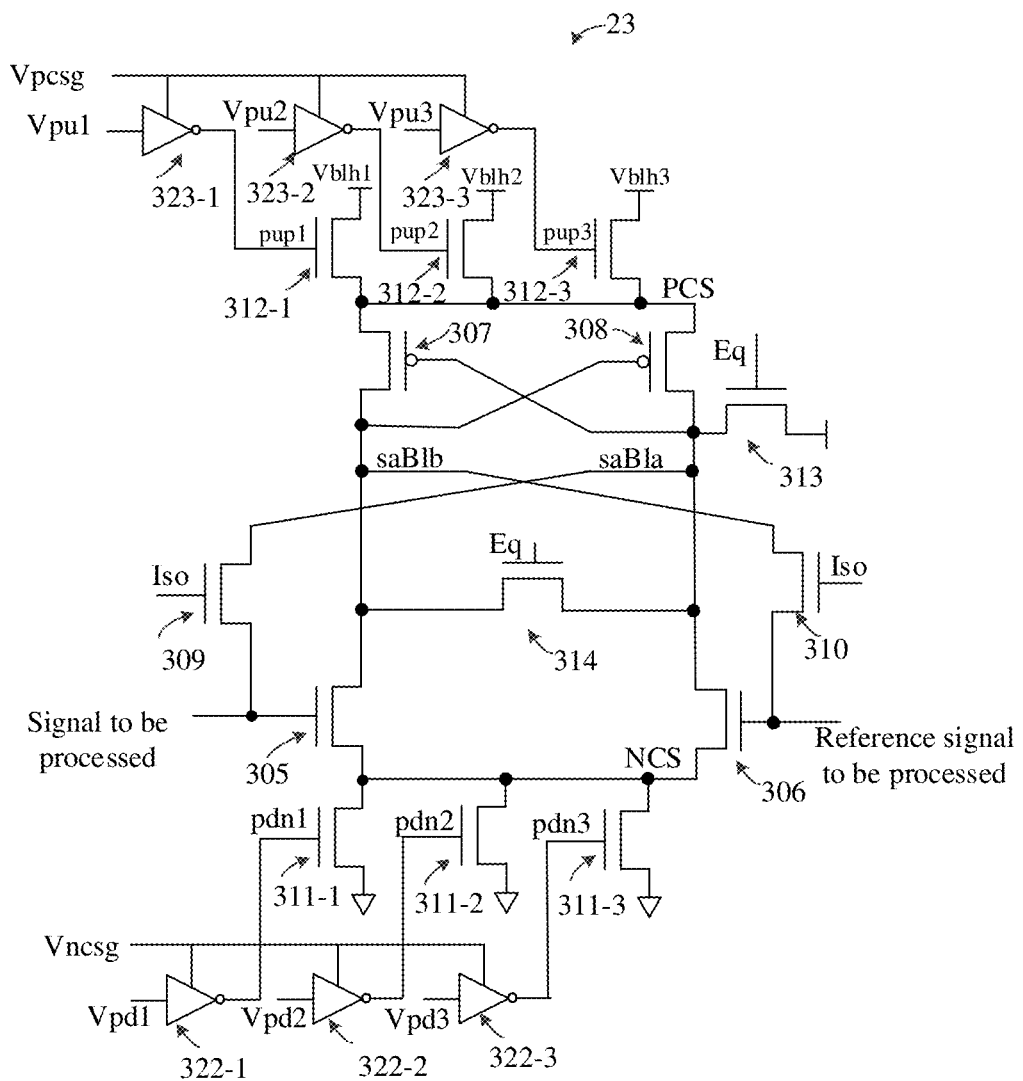
FIG. 5 is a partial detailed structural diagram of another control amplifying circuit according to an embodiment of the present disclosure.

In one specific embodiment, on the basis of FIG. 3, as shown in FIG. 5, the cross-coupled circuit 231 may include a fifth switching transistor 305, a sixth switching transistor 306, a seventh switching transistor 307 and an eighth switching transistor 308, and the control circuit 232 includes a ninth switching transistor 309 and a tenth switching transistor 310.

A first end of the fifth switching transistor 305 is connected with a third end of the ninth switching transistor 309 for receiving the signal to be processed, and a second end of the fifth switching transistor 305, a third end of the seventh switching transistor 307 and a first end of the eighth switching transistor 308 are connected with a second end of the tenth switching transistor 310. The second end of the fifth switching transistor 305, the third end of the seventh switching transistor 307, the first end of the eighth switching transistor 308 and the second end of the tenth switching transistor 310 are both connected to the complementary readout bit line.

A first end of the sixth switching transistor 306 is connected with a third end of the tenth switching transistor 310 for receiving a reference signal to be processed, and a second end of the sixth switching transistor 306, a third end of the eighth switching transistor 308 and a first end of the seventh switching transistor 307 are connected with a second end of the ninth switching transistor 309. The second end of the sixth switching transistor 306, the third end of the eighth switching transistor 308, the first end of the seventh switching transistor 307 and the second end of the ninth switching transistor 309 are both connected to the readout bit line.

A third end of the fifth switching transistor 305 and a third end of the sixth switching transistor 306 are connected with a first reference signal NCS, a second end of the seventh switching transistor 307 and a second end of the eighth switching transistor 308 are connected with a second reference signal PCS, and a first end of the ninth switching transistor 309 and a first end of the tenth switching transistor 310 are connected with the isolation control signal Iso.

It should be noted that the fifth switching transistor 305, the sixth switching transistor 306, the ninth switching transistor 309 and the tenth switching transistor 310 are N-type FETs, and the seventh switching transistor 307 and the eighth switching transistor 308 are P-type FETs.

Thus, when the isolation control signal Iso is in the second level state (having the first voltage value or the second voltage value), the ninth switching transistor 309 and the tenth switching transistor 310 in the control circuit 232 are turned on, and the cross-coupled circuit 231 receives the signal to be processed. When the isolation control signal Iso is in the first level state (having the third voltage value), the ninth switching transistor 309 and the tenth switching transistor 310 in the control circuit 232 are turned off, and the cross-coupled circuit 231 is not connected to the external signal.

It should be noted that, during signal amplification, the first reference signal NCS may be used to provide a low reference potential for the cross-coupled circuit 231, and the second reference signal PCS may be used to provide a high reference potential for the cross-coupled circuit 231. Based on this, the amplification principle of the cross-coupled circuit 231 is briefly described as follows.

Assuming that the stored data of the target detection unit is "0", the voltage of the signal to be processed is lower than the voltage of the reference signal to be processed. The amplification phase of the cross-coupled circuit 231 includes a first amplification phase and an evolution phase.

In the first amplification phase, the isolation control signal Iso is in the second voltage value of the second level state, the ninth switching transistor 309 and the tenth switching transistor 310 are turned on, the bit line is connected with the readout bit line, and the complementary bit line is connected to the complementary readout bit line. In such case, the reference signal to be processed is transmitted to the readout bit line, so that the sixth switching transistor 306 is turned on, the potential on the readout bit line is pulled low based on the low reference potential, then the seventh switching transistor 307 is turned on, and the potential on the complementary readout bit line is pulled high based on the high reference potential.

In the evolution phase, the isolation control signal Iso is in the first voltage value of the second level state, the conduction degrees of the ninth switching transistor 309 and the tenth switching transistor 310 are increased, the potential on the readout bit line after being pulled low is transmitted to the bit line through the ninth switching transistor 309, the reference signal to be processed on the bit line is quickly pulled low, and the reference signal to be processed on the complementary bit line is quickly pulled high through the tenth switching transistor 310, so that the voltage difference between the signal to be processed and the reference signal to be processed is increased to obtain the target amplified signal.

Assuming that the stored data of the target detection unit is "1", the voltage of the signal to be processed is higher than the voltage of the reference signal to be processed. In the first amplification phase, the fifth switching transistor 305 is in the on-state, potential pull-down processing is performed on the complementary readout bit line based on the low reference potential, the eighth switching transistor 308 is in the on-state, and potential pull-up processing is performed on the readout bit line based on the high reference potential.

In the evolution phase, the isolation control signal Iso is in the first voltage value of the second level state, the conduction degrees of the ninth switching transistor 309 and the tenth switching transistor 310 are increased, the potential on the readout bit line after being pulled high is transmitted to the bit line, the reference signal to be processed on the bit line is quickly pulled high, and the reference signal to be processed on the complementary bit line is quickly pulled low through the tenth switching transistor 310, so that the voltage difference between the signal to be processed and the reference signal to be processed is increased to obtain the target amplified signal subsequently.

It should also be noted that, during signal amplification, when the amplifying circuit 23 starts to amplify, since the isolation control signal Iso is at the second voltage value, the gate voltages of the ninth switching transistor 309 and the tenth switching transistor 310 are low, the voltage of the bit line or the complementary bit line is raised slowly without generating a high noise, so that the stored data of the adjacent memory cells is not affected. Therefore, the sensing amplitude of the amplifying circuit 23 can be improved, while the internal nodes of the amplifying circuit 23 can quickly reach a low reference potential or a high reference potential. In the evolution phase, when the isolation control signal Iso is at the first voltage value, the gate voltages of the ninth switching transistors 309 and the tenth switching transistor 310 are raised, and the voltage flowing through the bit line or the complementary bit line is raised. Since the internal node voltage of the amplifying circuit 23 has changed, the bit line or the complementary bit line is quickly pulled high or low, so that the signal amplification speed is improved, and noise generated when the potential of the bit line or the complementary bit line is raised is suppressed.

In some embodiments, as shown in FIG. 3, the amplifying circuit 23 further includes a first reference circuit 233 and a second reference circuit 234.

The first reference circuit 233 is configured to receive a first reference control signal and output the first reference signal according to the first reference control signal.

The second reference circuit 234 is configured to receive a second reference control signal and output the second reference signal according to the second reference control signal.

A voltage value of the first reference signal is a fourth voltage value or a fifth voltage value, a voltage value of the second reference signal is the fourth voltage value or a sixth voltage value, and the fourth voltage value is an intermediate value between the fifth voltage value and the sixth voltage value.

It should be noted that the first reference signal may provide a low reference potential to the cross-coupled circuit 231, and the second reference signal may provide a high reference potential to the cross-coupled circuit, so that the cross-coupled circuit 231 may perform amplification processing on the signal to be processed and the reference signal to be processed according to the high reference potential (i.e., the fifth voltage value) and the low reference potential (i.e., the sixth voltage value).

Exemplarily, as shown in FIG. 5, the first reference circuit 233 includes n eleventh switching transistors (e.g., an eleventh switching transistor 311-1, an eleventh switching transistor 311-2 and an eleventh switching transistor 311-3). n is a positive integer.

A first end of each eleventh switching transistor is connected with a respective one of first reference control signals (e.g., pdn1, pdn2, pdn3 in FIG. 5), and a third end of each eleventh switching transistor 311 is connected with a ground signal.

A second end of each eleventh switching transistor is connected with an output end of the first reference circuit 233 for outputting the first reference signal NCS.

It should be noted that three eleventh switching transistors are shown in FIG. 5, but the number of the eleventh switching transistors may be more or less in a practical application scenario. In addition, the number of the first reference control signals is also more than one, and one first reference control signal corresponds to one eleventh switching transistor. The level states of the multiple first reference control signals may be different, i.e., the level states of the respective pdn1, pdn2, and pdn3 are individually varied. That is, one eleventh switching transistor is individually controlled by one first reference control signal.

As shown in FIG. 5, all eleventh switching transistors may be N-type FETs. Taking the eleventh switching transistor 311-1 as an example, when the first reference control signal pdn1 is in the first level state, the eleventh switching transistor 311-1 is turned off. When the first reference control signal pdn1 is in the second level state, the eleventh switching transistor 311-1 is turned on.

Thus, the potential of the first reference signal NCS can be adjusted by the eleventh switching transistor in the on-state through the first reference circuit 233, thereby providing a low reference potential for the cross-coupled circuit 231. In addition, each of different eleventh switching transistors is connected with a separate ground potential, and the specific voltage values of these ground potentials may be different to provide different voltage drop speeds of the first reference signal NCS. In addition, the voltage drop speed of the first reference signal NCS may be controlled by controlling the number of the eleventh switching transistors in the on-state. In this way, by controlling the voltage adjustment speed to be different, it is able to reduce the noise generated when the voltage of the signal to be processed is rapidly reduced during the signal amplification.

In some embodiments, as shown in FIG. 5, the second reference circuit 234 includes m twelfth switching transistors (e.g., a twelfth switching transistor 312-1, a twelfth switching transistor 312-2, and a twelfth switching transistor 312-3 in FIG. 5), and m is a positive integer. A first end of each twelfth switching transistors is connected with a respective one of second reference control signals (e.g., pup1, pup2, pup3 in FIG. 5), and a second end of each twelfth switching transistors is connected with a respective one of third preset power supplies (e.g., Vblh1, Vblh2, Vblh3 in FIG. 5).

The third end of each twelfth switching transistor is connected with an output end of the second reference circuit 234 for outputting the second reference signal PCS.

It should be noted that three twelfth switching transistors are shown in FIG. 5, but the number of the twelfth switching transistors 312 may be more or less in a practical application scenario. In addition, the number of the second reference control signals is also more than one, and one second reference control signal corresponds to one twelfth switch transistor. The level states of the multiple second reference control signals may be different, i.e., the level states of the respective pup1, pup2, and pup3 are individually varied. That is, one twelfth switching transistor is individually controlled by one second reference control signal.

As shown in FIG. 5, the twelfth switching transistors may be N-type FETs. Therefore, taking the twelfth switching transistor 312-1 as an example, when the second reference control signal pup1 is in the first level state, the twelfth switching transistor 312-1 is turned off. When the first reference control signal pup1 is in the second level state, the twelfth switching transistor 312-1 is turned on.

Thus, the twelfth switching transistor in the on-state charges the second reference signal PCS to the second level state (a high reference potential), to provide a high reference potential for the cross-coupled circuit 231. Each of different twelfth switching transistors is connected with a separate third preset power supply, the voltage values of these third preset power supplies may be different to provide different voltage rise speeds of the second reference signal PCS. In addition, the voltage rise speeds may be controlled by controlling the number of the twelfth switching transistors in the on-state. In this way, by controlling the voltage rise speed to be different, it is able to reduce the noise generated when the voltage of the second reference signal is rapidly raised during the signal amplification.

In some embodiments, as shown in FIG. 3, the amplifying circuit 23 further includes a first signal establishing circuit 235 and a second signal establishing circuit 236.

The first signal establishing circuit 235 is configured to receive a first control input signal and output the first reference control signal.

The second signal establishing circuit 236 is configured to receive a second control input signal and output the second reference control signal.

In one specific embodiment, as shown in FIG. 5, the first signal establishing circuit 235 includes n second inverters (e.g., a second inverter 322-1, a second inverter 322-2, a second inverter 322-3 in FIG. 5), and the second signal establishing circuit 236 includes m third inverters (e.g., a third inverter 323-1, a third inverter 323-2, a third inverter 323-3 in FIG. 5). m and n may be the same value, or may be different values.

An input end of each second inverter is connected with a respective one of first control input signals (e.g., Vpd1, Vpd2, Vpd3 in FIG. 5), and an output end of each second inverter is configured to output the respective one of first reference control signals (e.g., pdn1, pdn2, pdn3 in FIG. 5). A first reference control signal of each eleventh switching transistor is output through one of the second inverters.

An input end of each third inverter is connected with a respective one of second control input signals (e.g., Vpu1, Vpu2, Vpu3 in FIG. 5), and an output end of each third inverter is configured to output the respective one of second reference control signals (e.g., pup1, pup2, pup3 in FIG. 5). A second reference control signal of each twelfth switching transistor is output through one of the third inverters.

It should be noted that, as shown in FIG. 5, the input end of each second inverter is also connected with a power supply signal Vncsg. When the first control input signal is in the first level state, the second inverter outputs the first reference control signal in the second level state according to the power supply signal Vncsg. When the first control input signal is in the second level state, the second inverter outputs the first reference control signal in the first level state.

Similarly, the input end of each third inverter is also connected with a power supply signal Vpcsg. When the second control input signal is in the first level state, the third inverter outputs the second reference control signal in the second level state according to the power supply signal Vpcsg. When the second control input signal is in the second level state, the third inverter outputs the second reference control signal in the first level state.

Figure 6:
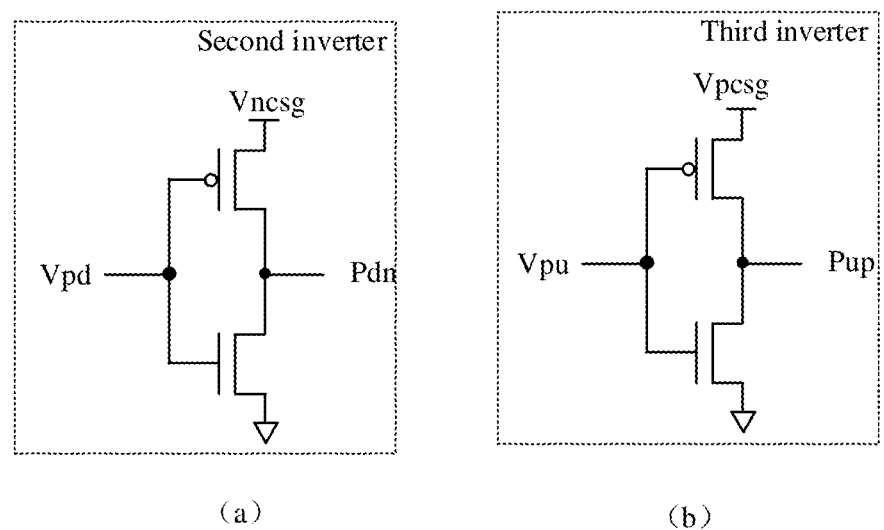
FIG. 6 is a schematic structural diagram of an inverter according to an embodiment of the present disclosure.

The second inverter and the third inverter may adopt the same circuit structure, for example, implemented by one N-type FET and one P-type FET. FIG. 6 illustrates a schematic structural diagram of an inverter according to an embodiment of the present disclosure. The specific structure of the second inverter is shown in (a) of FIG. 6, and the specific structure of the third inverter is shown in (b) of FIG. 6.

It should also be noted that the number of first control input signals is also more than one, one second inverter is used to receive one first control input signal, and the level states of these first control input signals may be different. Taking the first control input signal Vpd1 in FIG. 5 as an example, when the first control input signal Vpd1 is in the first level state, the second inverter 322-1 outputs the first reference control signal pdn1 in the second level state, and in such case, the eleventh switching transistor 311-1 is in the on-state. Conversely, when the first control input signal Vpd1 is in the second level state, the second inverter 322-1 outputs the first reference control signal pdn1 in the first level state, and in such case, the eleventh switching transistor 311-1 is in the off-state.

Similarly, the number of second control input signals is also more than one, one third inverter is used to receive one second control input signal, and the level states of these second control input signals may be different. Taking the second control input signal Vpu1 in FIG. 5 as an example, when the second control input signal Vpu1 is in the first level state, the third inverter 323-1 outputs the second reference control signal pup1 in the second level state, and in such case, the twelfth switching transistor 312-1 is in the on-state. Conversely, when the second control input signal Vpu1 is in the second level state, the third inverter 323-1 outputs the second reference control signal pup1 in the first level state, and in such case, twelfth switching transistor 312-1 is in the off-state.

Thus, by the first signal establishing circuit, the second signal establishing circuit, the first reference circuit, and the second reference circuit, the first reference signal and the second reference signal with different voltage adjustment speeds can be provided for the cross-coupled circuit, thereby implementing the amplification process of the signal to be processed.

In some embodiments, as illustrated in FIG. 5, the amplifying circuit 23 further includes a precharge circuit, and the precharge circuit includes a thirteenth switching transistor 313 and a fourteenth switching transistor 314.

A first end of the thirteenth switching transistor 313 and a first end of the fourteenth switching transistor 314 are connected with a precharge signal Eq.

A second end of the thirteenth switching transistor 313 is connected with a fourth preset power supply. A third end of the thirteenth switching transistor 313 is connected with the second end of the sixth switching transistor 306.

A third end of the fourteenth switching transistor 314 is connected with the second end of the fifth switching transistor 305, and a second end of the fourteenth switching transistor 314 is connected with the second end of the sixth switching transistor 306.

The thirteenth switching transistor 313 and the fourteenth switching transistor 314 are both N-type FETs.

In this way, in response to the precharge signal Eq, the precharge circuit performs a precharge process for the amplifying circuit 23, and enables the respective circuit nodes of the amplifying circuit 23 are set to have the same voltage value after completion of the precharge process.

Figure 7:
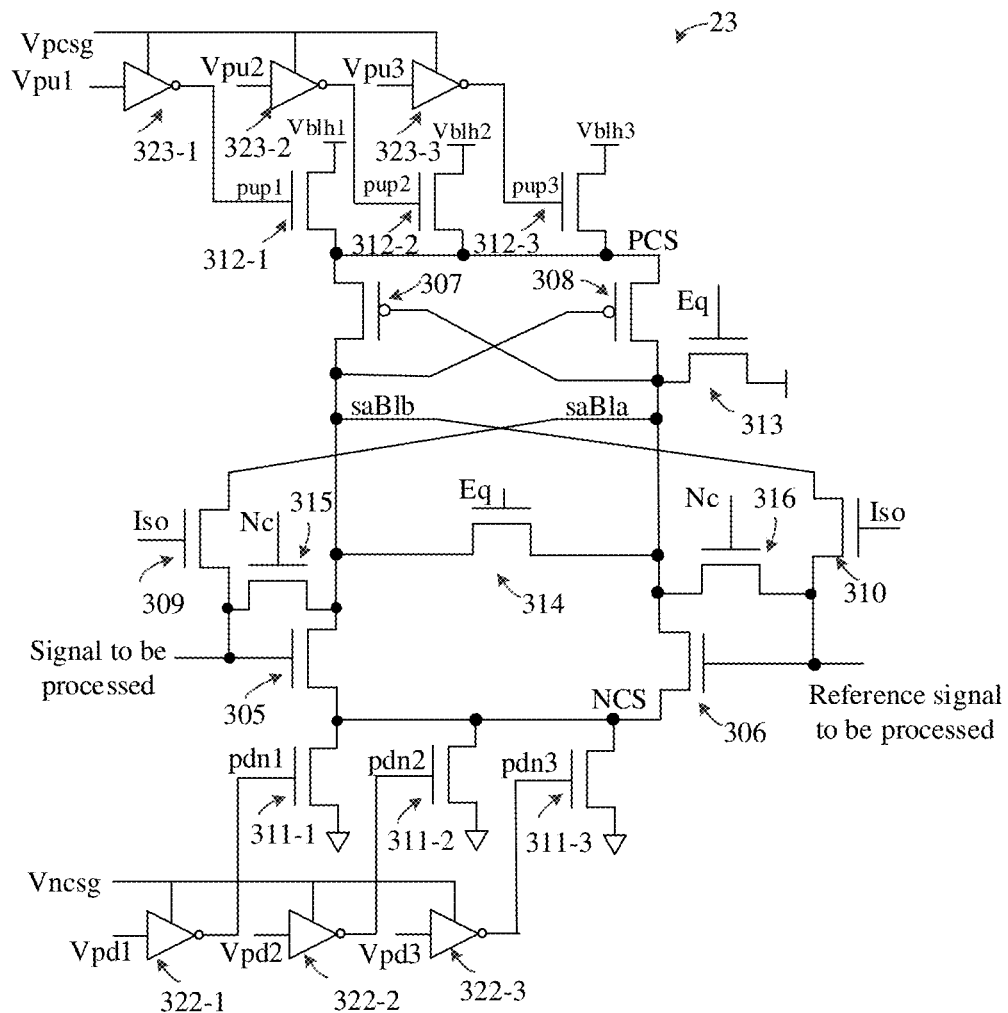
FIG. 7 is a partial detailed structural diagram of another control amplifying circuit according to an embodiment of the present disclosure.

In some embodiments, on the basis of FIG. 5, as shown in FIG. 7, the amplifying circuit 23 further includes a noise cancellation circuit, and the noise cancellation circuit includes a fifteenth switching transistor 315 and a sixteenth switching transistor 316.

A first end of the fifteenth switching transistor 315 and a first end of the sixteenth switching transistor 316 are connected with a noise cancellation signal Nc.

A second end of the fifteenth switching transistor 315 is connected with the second end of the fifth switching transistor 305, and a third end of the fifteenth switching transistor 315 is connected with the first end of the fifth switching transistor 305.

A second end of the sixteenth switching transistor 316 is connected with the second end of the sixth switching transistor 306, and a third end of the sixteenth switching transistor 316 is connected with the first end of the sixth switching transistor 306.

The fifteenth switching transistor 315 and the sixteenth switching transistor 316 are both N-type FETs. Therefore, when the noise cancellation signal is in the second level state, the fifteenth switching transistor 315 and the sixteenth switching transistor 316 are in the on-state, so that the first and third ends of the fifth switching transistor 305 are connected, and the first and third ends of the sixth switching transistor 306 are connected, thereby performing an offset cancellation operation on the fifth switching transistor 305 and the sixth switching transistor 306. In this way, a threshold value difference of the switching transistors in the signal amplification process can be further eliminated, and accuracy of sensing on the signal to be processed in the amplification process can be improved.

In particular, FIG. 4, FIG. 5 and FIG. 7 are only one alternative circuit structure for the control amplifying circuit. The first switching transistor 301, the second switching transistor 302, the third switching transistor 303, the seventh switching transistor 307 and the eighth switching transistor 308 are P-type channel FETs. The fourth switching transistor 304, the fifth switching transistor 305, the sixth switching transistor 306, the ninth switching transistor 309, the tenth switching transistor 310, the eleventh switching transistor 311, the twelfth switching transistor 312, the thirteenth switching transistor 313, the fourteenth switching transistor 314, the fifteenth switching transistor 315 and the sixteenth switching transistor 316 are N-type channel FETs. Of course, the types of the above switching transistors do not constitute a limitation to the embodiments of the present disclosure. In a practical application scenario, the foregoing circuit control logic may be realized by various types of circuit devices, and may be specifically selected according to the practical application scenario.

To sum up, in the embodiments of the present disclosure, by adding the power supply switching circuit, the preset power supply signal having two voltage values (the first voltage value or the second voltage value) is provided, and the isolation control circuit may output an isolation control signal having three different voltage values (the first voltage value, the second voltage value, or the third voltage value) according to the preset power supply signal. When the amplifying circuit is in the non-operating state, the voltage of the preset power supply signal can be dropped to the second voltage value to reduce the leakage phenomenon of the switching transistors in the isolation control circuit, avoid the failure of the switching transistors, and prolong the service life of the isolation control circuit. In addition, in different operation phases of the amplifying circuit, the voltage value of the isolation control signal is adjusted to be the first voltage value or the second voltage value, the noise generated when the potential of the signal to be processed rises is eliminated, the voltage change speed of the signal to be processed is increased, and the signal amplification process is optimized, thereby solving the problems that the signal amplification speed is slow and the circuit noise is high.

Figure 8:
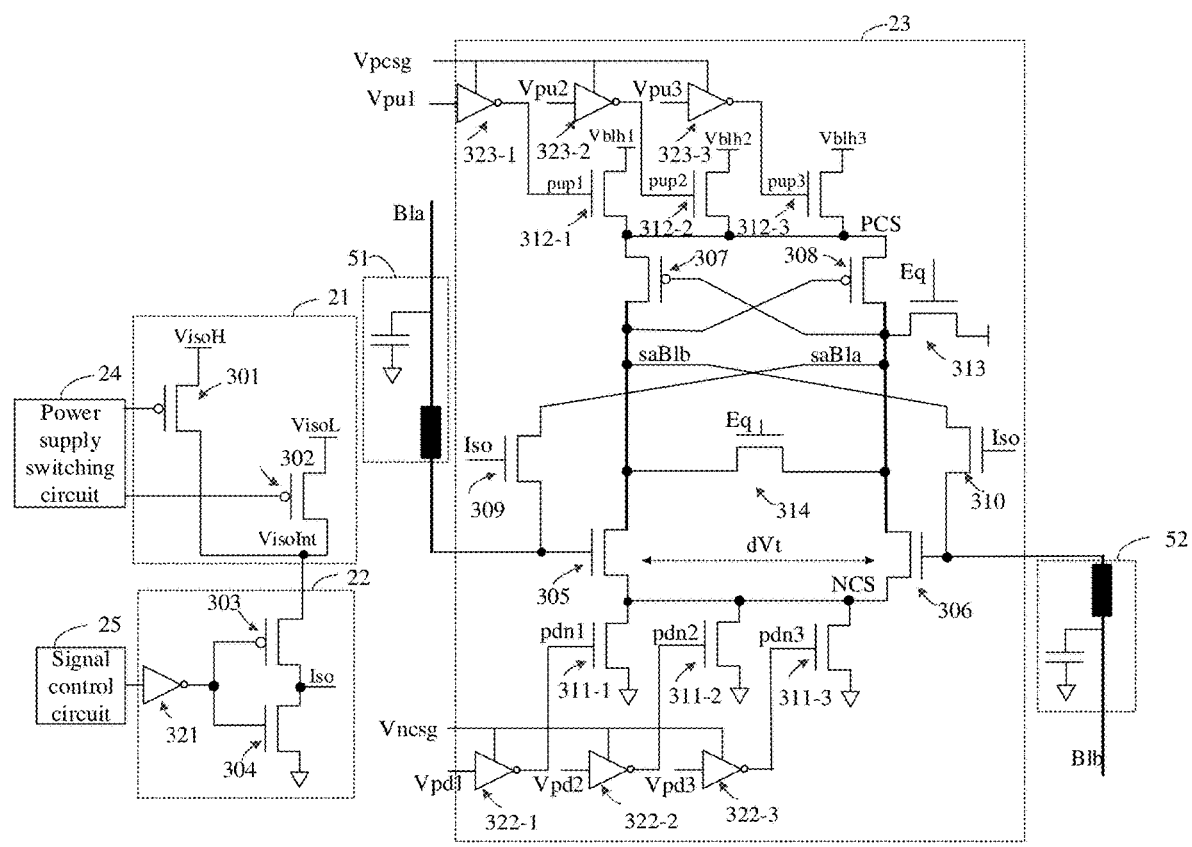
FIG. 8 is a schematic diagram of an application scenario of a control amplifying circuit according to an embodiment of the present disclosure.

In another embodiment of the present disclosure, reference is made to FIG. 8, which illustrates an application scenario diagram of a control amplifying circuit 20 according to an embodiment of the present disclosure. As shown in FIG. 8, in this application scenario, there are a bit line Bla, a complementary bit line Blb, a readout bit line saBla, a complementary readout bit line saBlb and a control amplifying circuit 20. A first memory cell 51 is provided on the bit line Bla, and a second memory cell 52 is provided on the complementary bit line Blb. The first memory cell 51 and the second memory cell 52 may both serve as the target detection unit mentioned above.

The control amplifying circuit 20 includes a power supply output circuit 21, an isolation control circuit 22, a power supply switching circuit 214, an isolation control circuit 22 and an amplifying circuit 23. The power supply output circuit 21 includes a first switching transistor 301 and a second switching transistor 302, and the isolation control circuit 22 includes a third switching transistor 303, a fourth switching transistor 304 and a first inverter 321. The amplifying circuit 23 may include a fifth switching transistor 305, a sixth switching transistor 306, a seventh switching transistor 307, an eighth switching transistor 308, a ninth switching transistor 309, a tenth switching transistor 310, three eleventh switching transistors (an eleventh switching transistor 311-1, an eleventh switching transistor 311-2 and an eleventh switching transistor 311-3 in FIG. 9), three twelfth switching transistors (a twelfth switching transistor 312-1, a twelfth switching transistor 312-2 and a twelfth switching transistor 312-3 in FIG. 9), a thirteenth switching transistor 313, a fourteenth switching transistor 314, three second inverters (a second inverter 322-1, a second inverter 322-2 and a second inverter 322-3 in FIG. 9) and three third inverters (a third inverter 323-1, a third inverter 323-2 and a third inverter 323-3 in FIG. 9). The connection relationship and type of each device are shown in FIG. 9, and the operating principle of its circuit can refer to the above description, which will not be elaborated here.

Based on the above circuit structure, a control method for an amplifying circuit 23 is briefly described.

Figure 9:
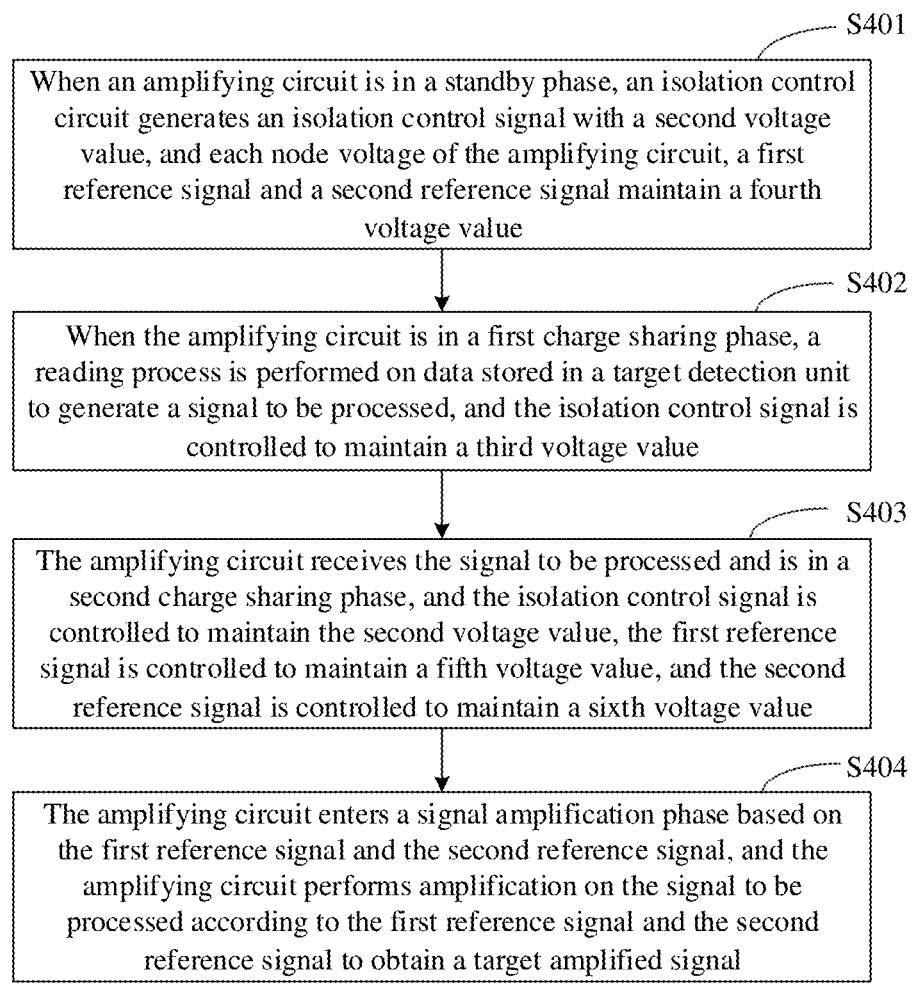
FIG. 9 is a schematic flowchart of a control method for an amplifying circuit according to an embodiment of the present disclosure.

FIG. 9 illustrates a schematic flowchart of a control method for an amplifying circuit according to an embodiment of the present disclosure. As shown in FIG. 9, the method may include the following operations.

In S401, when the amplifying circuit is in a standby phase, an isolation control circuit generates an isolation control signal with a second voltage value, and each node voltage of the amplifying circuit, a first reference signal and a second reference signal maintain a fourth voltage value.

In such case, the precharge signal is in the second level state, the thirteenth switching transistor 313 and the fourteenth switching transistor 314 are turned on, the first reference control signal and the second reference control signal are connected with the fourth power supply, and each node voltage of the amplifying circuit, the first reference signal and the second reference signal maintain the fourth voltage value. That is, the bit line Bla, the complementary bit line Blb, the readout bit line saBla and the complementary readout bit line saBlb are all at the fourth voltage value. Then, the precharge signal is in the first level state, and the thirteenth switching transistor 313 and the fourteenth switching transistor 314 are both turned off.

In S402, when the amplifying circuit is in a first charge sharing phase, a reading process is performed on data stored in a target detection unit to generate a signal to be processed, and the isolation control signal is controlled to maintain a third voltage value.

It should be noted that the target detection unit is turned on according to the operation instruction, and transmits the stored potential to the connected bit line Bla to form the signal to be processed. The amplifying circuit is in the first charge sharing phase.

The power supply output circuit selects the second voltage value to output as a preset power supply signal according to the power supply switching signal, and the isolation control circuit generates the isolation control signal Iso with the third voltage value according to the control command signal in the first state. In such case, since the ninth switching transistor 309 and the tenth switching transistor 310 are in the off-state, the bit line Bla and the target detection unit perform charge sharing, and the potential of the bit line Bla is lower or higher than the fourth voltage value.

In S403, the amplifying circuit receives the signal to be processed and is in a second charge sharing phase, the isolation control signal is controlled to maintain the second voltage value, the first reference signal is controlled to maintain a fifth voltage value, and the second reference signal is controlled to maintain a sixth voltage value.

It should be noted that, after the first charge sharing phase, the potential of the bit line Bla is stabilized, the power supply output circuit selects the second voltage value to output as the preset power supply signal according to the power supply switching signal, the isolation control circuit generates the isolation control signal Iso having the second voltage value according to the control command signal in the second state, and the ninth switching transistor 309 and the tenth switching transistor 310 are turned on.

The bit line Bla is connected with the readout bit line saBla, the complementary bit line Blb is connected with the complementary readout bit line saBlb, and the bit line Bla lower or higher than the fourth voltage value is charge-shared with the readout bit line saBla, so that the potential of the readout bit line saBla is lower or higher than the fourth voltage value.

In S404, the amplifying circuit enters a signal amplification phase based on the first reference signal and the second reference signal, and the amplifying circuit performs amplification on the signal to be processed according to the first reference signal and the second reference signal to obtain a target amplified signal.

Figure 10:
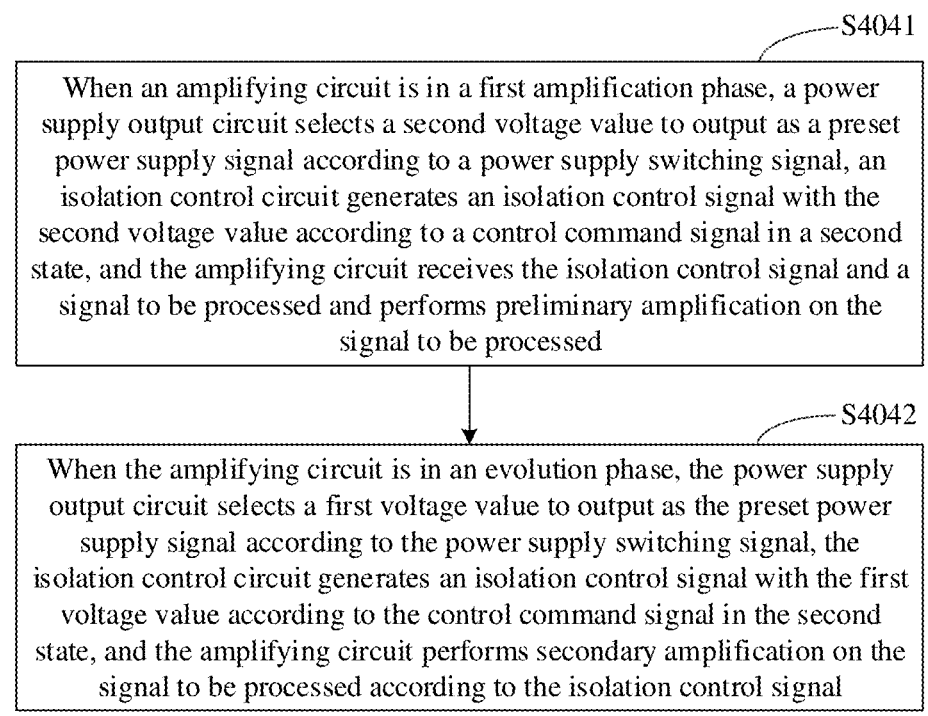
FIG. 10 is a schematic flowchart of another control method for an amplifying circuit according to an embodiment of the present disclosure.

It should be noted that, in some embodiments, the signal amplification phase includes a first amplification phase and an evolution phase. On the basis of FIG. 9, as shown in FIG. 10, the method further includes the following operations.

In S4041, when the amplifying circuit is in the first amplification phase, a power supply output circuit selects a second voltage value to output as a preset power supply signal according to a power supply switching signal, an isolation control circuit generates an isolation control signal with the second voltage value according to a control command signal in a second state, and the amplifying circuit receives the isolation control signal and a signal to be processed and performs preliminary amplification on the signal to be processed.

It should be noted that, in the first amplification phase, the isolation control signal continues to maintain the second voltage value. The ninth switching transistor 309 and the tenth switching transistor 310 are turned on, the voltage of the first reference signal is dropped from the fourth voltage value to the fifth voltage value, the voltage of the second reference signal is raised from the fourth voltage value to the sixth voltage value, the sixth switching transistor 306 and the seventh switching transistor 307 are turned on due to a change in the potential of the readout bit line saBla, and the potential of the readout bit line saBla is pulled up to the sixth voltage value, or the fifth switching transistor 305 or the eighth switching transistor 308 is turned on, and the potential of the readout bit line saBla is pulled down to the fifth voltage value.

In S4042, when the amplifying circuit is in an evolution phase, the power supply output circuit selects a first voltage value to output as the preset power supply signal according to the power supply switching signal, the isolation control circuit generates an isolation control signal with the first voltage value according to the control command signal in the second state, and the amplifying circuit performs secondary amplification on the signal to be processed according to the isolation control signal.

It should be noted that, in the evolution phase, the power supply output circuit selects the first voltage value to output as the preset power supply signal according to the power supply switching signal, the isolation control circuit generates the isolation control signal Iso with the first voltage value according to the control command signal in the second state, the conduction degrees of the ninth switching transistor 309 and the tenth switching transistor 310 are increased, and the potential of the readout bit line saBla quickly pulls the potential of the bit line Bla high or down to obtain the target amplified signal.

At the same time, the potential of the bit line Bla is pulled high or down, which causes the potential of the connected target detection unit to change synchronously, thereby realizing the recovery of the data stored in the target detection unit.

It should be noted that the control method for the amplifying circuit provided in the embodiments of the present disclosure is applied to the amplifying circuit mentioned above. Specifically, the amplifying circuit is connected with the target detection unit. Herein, the target detection unit may be a memory unit (or referring to cell) in the DRAM.

In some embodiments, the signal amplification phase further includes a precharge phase.

After the stored data in the target detection unit is recovered, the switch of the target detection unit is controlled to be turned off. After that, the amplifying circuit is in the precharge stage, the isolation control signal is controlled to maintain the first voltage value, the precharge signal is in the second voltage state, the fourth preset power supply controls the first reference signal to recover from the fifth voltage value to the fourth voltage value, and controls the second reference signal to recover from the sixth voltage value to the fourth voltage value, and the voltage of each node of the amplifying circuit is also recovered to the fourth voltage value.

It should be noted that when the amplifying circuit is in the evolution phase, it is necessary to amplify the signal to be processed and write data back to the target detection unit at the same time, so as to prevent the data of the target detection unit from being lost after being read out. The amplifying circuit is in the precharge stage to recovery the amplifying circuit to the standby phase, so as to receive the operation of the next preset operation instruction.

Figure 11:
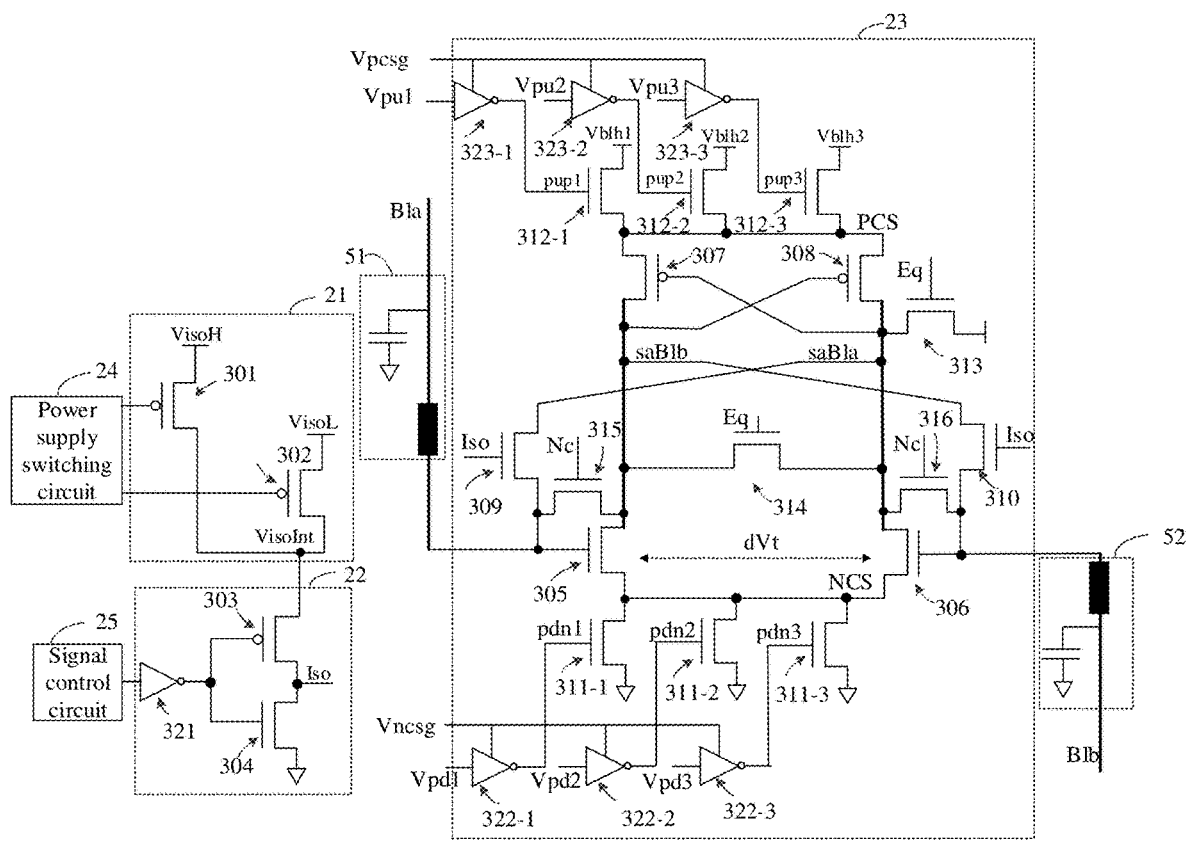
FIG. 11 is a schematic diagram of an application scenario of another control amplifying circuit according to an embodiment of the present disclosure.

On the basis of FIG. 8, FIG. 11 illustrates a schematic diagram of an application scenario of another control amplifying circuit 20 according to an embodiment of the present disclosure. As shown in FIG. 11, the amplifying circuit further includes a fifteenth switching transistor 315 and a sixteenth switching transistor 316. In this case, the amplifying circuit has a noise cancellation phase after the standby phase and before the first charge sharing phase.

Correspondingly, when the amplifying circuit is in the noise cancellation phase, the isolation control circuit generates the isolation control signal with the third voltage value according to the control command signal in the first state, the first reference signal NCS has the fifth voltage value, the second reference signal PCS has the sixth voltage value, the noise cancellation signal is in the first level state, and the fifteenth switching transistor 315 and the sixteenth switching transistor 316 are turned on, to realize the noise cancellation process of the noise cancellation circuit.

It should be noted that, in the noise cancellation phase, the fifteenth switching transistor 315 and the sixteenth switching transistor 316 are in the on-state, so that the first and third ends of the fifth switching transistor 305 are connected, and the first and third ends of the sixth switching transistor 306 are connected, thereby performing the offset cancellation operation on the fifth switching transistor 305 and the sixth switching transistor 306, and eliminating the threshold voltage difference between the fifth switching transistor 305 and the sixth switching transistor 306.

It should also be noted that the higher the gate voltage of the fifteenth switching transistor (or the sixteenth switching transistor), the greater the opening degree of the fifteenth switching transistor (or the sixteenth switching transistor), the faster the charge speed passing through the fifteenth switching transistor (or the sixteenth switching transistor), and the faster the voltage change. Therefore, after entering the first amplification stage, the voltage value of the signal to be processed is not higher than the second voltage value −Vt since the isolation control signal is the lower voltage value (the second voltage value) in the second level state. Vt refers to the threshold voltage of the fifteenth switching transistor (or the sixteenth switching transistor). The voltage change speed of the signal to be processed is reduced, which can suppress noise in the circuit when the voltage of the signal to be processed is raised, avoid affecting other memory cells, and improve the amplification margin.

Figure 12:
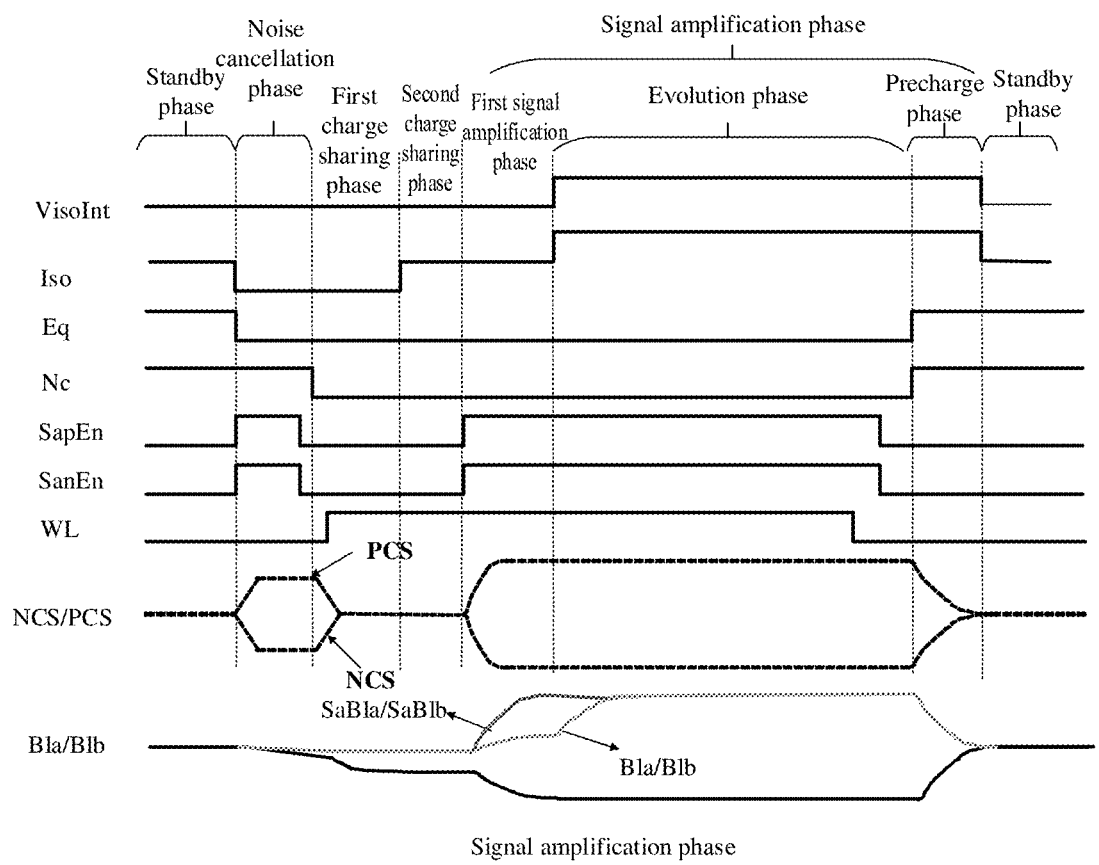
FIG. 12 is a signal timing diagram of an amplifying circuit according to an embodiment of the present disclosure.

On the basis of FIG. 11, FIG. 12 illustrates a signal timing diagram of an amplifying circuit according to an embodiment of the present disclosure. As shown in FIG. 12, the operation phase of the amplifying circuit includes a standby phase (or referring to IDEL), a noise cancellation phase (or referring to NC), a charge sharing phase (or referring to CS) and a signal amplification phase. The signal amplification phase may further include a first signal amplification phase, an evolution phase and a precharge phase.

In FIG. 12, VisoInt refers to the preset power supply signal mentioned above, and may be the first voltage value and the second voltage value. Iso refers to the isolation control signal mentioned above, which may be the first voltage value, the second voltage value, or the third voltage value. Eq refers to the precharge signal mentioned above, Nc refers to the noise cancellation signal mentioned above. SanEn refers to the first reference control signal mentioned above, and SapEn refers to the second reference control signal mentioned above. WL refers to a word line open signal. When WL is in the second level state, the word line in which the target detection unit is located is turned on, so that the target detection unit and the bit line are connected. When WL is in the first level state, the word line in which the target detection unit is located is turned off, so that the target detection unit and the bit line are not connected. NCS/PCS refers to the first reference signal/the second reference signal, in which the first reference signal has the fourth voltage value and the fifth voltage value, the second reference signal has the fourth voltage value and the sixth voltage value, and the fourth voltage value and the sixth voltage value have different voltage directions. Bla refers to the bit line, Blb refers to the complementary bit line, saBla refers to the readout bit line, and saBlb refers to the complementary readout bit line.

As shown in FIG. 12, when the amplifying circuit is in the standby phase, the preset power supply signal VisoInt maintains the second voltage value, the isolation control signal Iso maintains the second voltage value, the precharge signal Eq and the noise cancellation signal Nc are in the second level state, the first reference control signal SanEn/second reference control signal SapEn are in the first level state, the word line WL is in the off-state, the first reference signal NCS/second reference signal PCS maintain the fourth voltage value, and the bit line Bla/complementary bit line Blb and the readout bit line saBla/complementary readout bit line saBlb are in the fourth level value. In such case, each circuit node of the amplifying circuit 23 is at the same voltage value to prepare for executing the operation instruction of the user.

Assuming that the target detection unit is the first memory cell 51, after the user transmits the operation instruction for the target detection unit, the amplifying circuit 23 enters the noise cancellation phase from the standby phase. In such case, the isolation control signal Iso is adjusted from the second voltage value to the third voltage value, the precharge signal Eq is adjusted from the second level state to the first level state, and the first reference control signal SanEn/second reference control signal SapEn is adjusted from the first level state to the second level state, so the first reference signal NCS changes from the fourth voltage value to the fifth voltage value, the second reference signal PCS changes from the fourth voltage value to the sixth voltage value, and the noise cancellation signal Nc remains in the second level state, thereby performing noise cancellation processing on the amplifying circuit 23. Thereafter, the first reference control signal SanEn/second reference control signal SapEn is switched to the first level state, and the first reference signal NCS and the second reference signal PCS continue to be recovered to the fourth voltage value by the precharge power supply.

After the noise cancellation phase is ended, the word line opening signal WL changes to the second level state, and the word line in which the target detection unit is located is adjusted to the on-state, so that the amplifying circuit 23 enters the first charge sharing phase, and at this time, reading is performed on the target detection unit (e.g., the first memory cell 51). As shown in FIG. 12, after the first charge sharing phase is ended, the voltage change of the bit line Bla is stabilized, i.e., the signal to be processed is generated, and the complementary bit line Blb forms the reference signal to be processed. In other words, the first charge sharing phase may be regarded as charge sharing between the target detection unit and the bit line Bla. In addition, in the first charge sharing phase, the preset power supply signal maintains the second voltage value, and the isolation control signal Iso maintains the third voltage value, so that the bit line Bla and the readout bit line saBla are not connected, and the complementary bit line Blb and the complementary readout bit line saBlb are not connected. The precharge signal Eq, the noise cancellation signal Nc and the first reference control signal SanEn/second reference control signal SapEn are all in the first level state.

After the first charge sharing phase is ended, the amplifying circuit 23 enters a second charge sharing phase. In the second charge sharing phase, the isolation control signal Iso maintains the second voltage value, so that the bit line Bla and the readout bit line saBla are connected, and the complementary bit line Blb and the complementary readout bit line saBlb are connected, the amplifying circuit receives the signal to be processed and the reference signal to be processed to the internal node, which can be regarded as read charge sharing between the bit line Bla/complementary bit line Blb and the readout bit line saBla/complementary readout bit line saBlb. In addition, all signals except the isolation control signal Iso maintain the voltage values of the previous stage.

After the second charge sharing phase is ended, the amplifying circuit 23 enters the first signal amplification phase, the first reference control signal SanEn/the second reference control signal SapEn is adjusted from the first level state to the second level state, so that the first reference signal NCS changes from the fourth voltage value to the fifth voltage value, the second reference signal PCS changes from the fourth voltage value to the sixth voltage value, the amplifying circuit 23 can perform amplification on the signal to be processed (the signal on the bit line Bla)/the reference signal to be processed (the signal on the complementary bit line Blb) according to the first reference signal NCS/the second reference signal PCS, the isolation control signal Iso still maintains the second voltage value, to complete the signal amplification on the signal to be processed (the signal on the bit line Bla)/the reference signal to be processed (the signal on the complementary bit line Blb). In addition, since the isolation control signal Iso is at the second voltage value, the signal on the bit line Bla/complementary bit line Blb does not exceed the second voltage value −Vt, which avoids affecting other memory cells, while the signal on the readout bit line saBla/complementary readout bit line saBlb inside the amplifying circuit 23 can quickly reach the high reference potential/the low reference potential.

After the second charge sharing phase is ended, the amplifying circuit 23 enters the evolution phase. At this time, the preset power supply signal VisoInt maintains the first voltage value, the isolation control signal Iso maintains the first voltage value, and the conduction degrees of the ninth switching transistor 309 and the tenth switching transistor 310 are increased, so that the signal amplification on the signal to be processed (the signal on the bit line Bla)/the reference signal to be processed (the signal on the complementary bit line Blb) is completed. The amplified signal is output through the subsequent modules to obtain the target amplified signal, and the read operation is completed. At this phase, the data write-back of the target detection unit is also completed, which avoids data failure due to the read operation. As illustrated in FIG. 12, before the evolution phase is ended, the first reference control signal SanEn/second reference control signal SapEn is recovered to the first level state.

After the evolution phase is ended, the amplifying circuit 23 enters the precharge phase. The precharge signal Eq and the noise cancellation signal Nc are adjusted to the second level state. At this time, the first reference signal NCS/the second reference signal PCS is recovered to the fourth voltage value, and the bit line Bla/complementary bit line Blb and the readout bit line saBla/complementary readout bit line saBlb are recovered to the same voltage value.

After the precharge phase is ended, the amplifying circuit 23 enters the standby phase again to prepare for the next operation. In the above process, the operation instruction of a user may be a read instruction, a refresh instruction and a write instruction. In the process of executing the read instruction, the refresh instruction, and the write instruction by the amplifying circuit:

the preset power supply signal has the second voltage value in the standby phase, the noise cancellation phase, the first charge sharing phase, the second charge sharing phase and the first signal amplification phase of the amplifying circuit, and has the first voltage value in the evolution phase and the precharge phase of the amplifying circuit.

The isolation control signal has the second voltage value in the standby phase of the amplifying circuit, has the third voltage value in the noise cancellation phase and the first charge sharing phase, has the second voltage value in the second charge sharing phase and the first signal amplification phase, and maintains the first voltage value in both the evolution phase and the precharge phase.

In the process of executing the write instruction by the amplifying circuit, the evolution phase of the amplifying circuit is the write phase, used for writing the externally transmitted data into the memory cell through the change in the voltage on the bit line Bla.

Through voltage changes of the preset power supply signal and the isolation control signal, it is convenient for the amplifying circuit in the process of executing the read instruction, the refresh instruction and the write instruction to improve the signal processing speed and suppress the circuit noise in the signal processing process.

Figure 13:
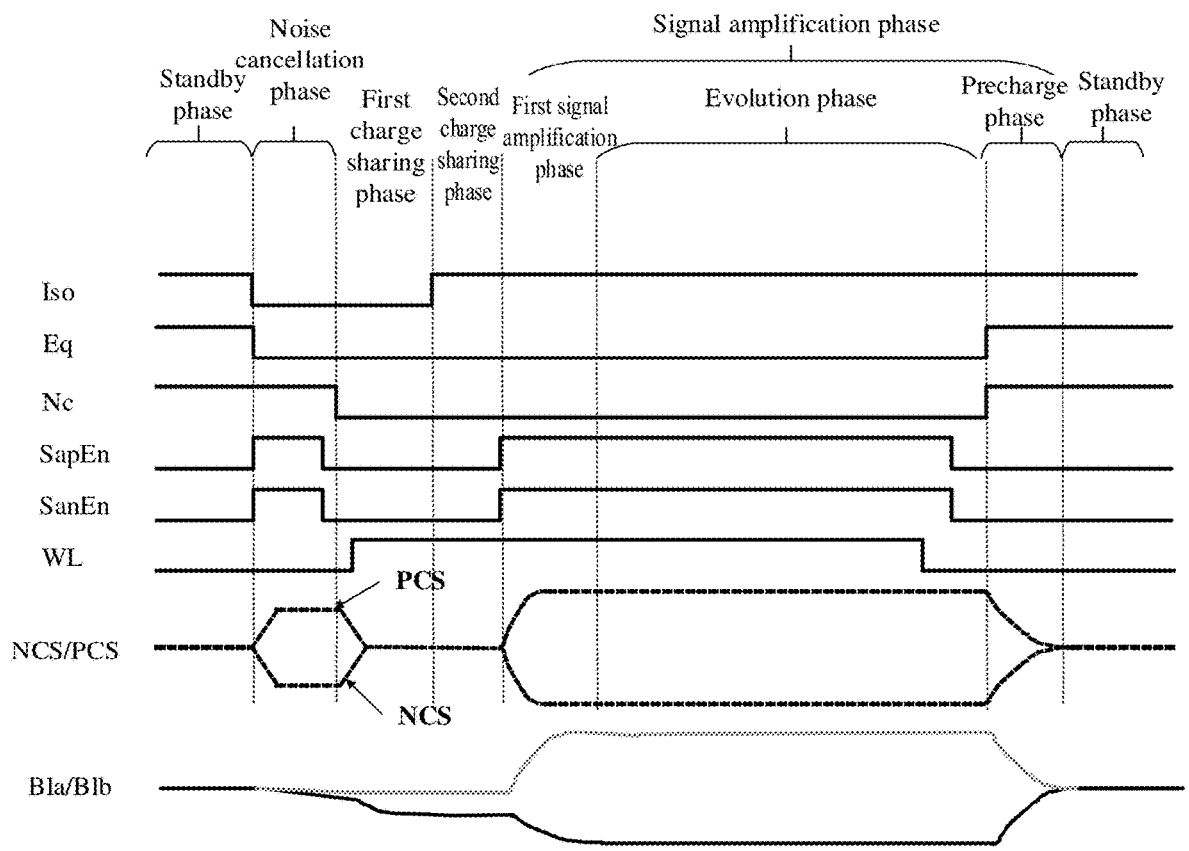
FIG. 13 is a timing diagram of signals according to some implementations.

In some implementations, referring to FIG. 13, a signal timing diagram according to some implementations is shown. In FIG. 13, since the preset power supply signal (not shown) is a fixed voltage value, the isolation control signal Iso has two voltage values, which belong to the first level state and the second level state, respectively. The meanings and change principles of other signals can be understood with reference to FIG. 12, which are not elaborated herein.

As can be seen from FIG. 12 and FIG. 13, the control amplifying circuit 20 provided by the embodiments of the present disclosure has at least the following advantages. In one aspect, in the standby stage, the isolation control signal is a lower voltage value (second voltage value) in the second level state, which can avoid the leakage of the switching transistors, reduce the device failure, and improve the service life of the semiconductor memory. In another aspect, when the control amplifying circuit enters the noise cancellation phase from the standby phase, the isolation control signal needs to be adjusted from the second level state to the first level state. Since the isolation control signal of the embodiments of the present disclosure has a lower voltage value in the standby phase, the level state is adjusted fast, and the speed of signal processing can be improved. In yet another aspect, after the control amplifying circuit enters the second signal sharing phase, since the isolation control signal has a lower voltage value (second voltage value) in the second level state, the voltage value of the signal to be processed is not higher than the second voltage value −Vt, so that noise in the circuit can be reduced, influence on other memory cells is avoided, and the amplification margin is improved. In yet another aspect, since the voltage value of the signal to be processed is not higher than the second voltage value −Vt, noise generated during voltage raise of the signal to be processed also can be reduced. In still yet another aspect, by controlling the states of the three eleventh switching transistors, the discharge speed of the first reference signal NCS can be adjusted, thereby reducing noise generated during the potential reduction of the signal to be processed.

The embodiments of the present disclosure provide a control amplifying circuit and a control method thereof. Specific implementation of the foregoing embodiments is described in detail by the present embodiment, and it can be seen that a specific voltage value of the preset power supply signal is adjusted using the power supply switching signal, so as to partially solve the problems that the signal amplification speed is slow and the circuit noise is high.

Figure 14:
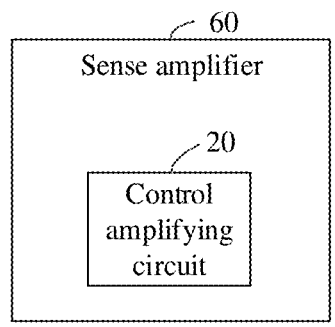
FIG. 14 is a schematic structural diagram of a sense amplifier according to an embodiment of the present disclosure.

In another embodiment of the present disclosure, referring to FIG. 14, a schematic structural diagram of a sense amplifier 60 according to an embodiment of the present disclosure is shown. As shown in FIG. 14, the sense amplifier 60 may include the control amplifying circuit 20 according to any one of the above embodiments.

In this way, since the sense amplifier 60 may include the control amplifying circuit 20 according to any one of the above embodiments, it is able to adjust the specific voltage value of the preset power supply signal by using the power supply switching signal, so as to partially improve the problems that the signal amplification speed is slow and the circuit noise is high.

Figure 15:
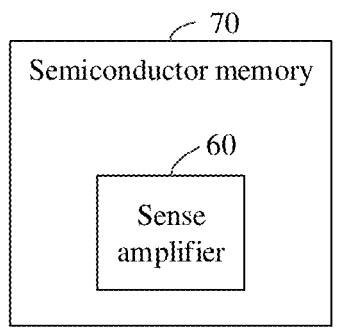
FIG. 15 is a schematic structural diagram of a semiconductor memory according to an embodiment of the present disclosure.

In another embodiment of the present disclosure, referring to FIG. 15, a schematic structural diagram of a semiconductor memory 70 according to an embodiment of the present disclosure is shown. As shown in FIG. 15, the semiconductor memory 70 may include the sense amplifier 60 according to any one of the above embodiments.

In the embodiments of the present disclosure, the semiconductor memory 70 may be a DRAM chip.

In this way, since the semiconductor memory 70 includes the sense amplifier 60 mentioned above, it is able to adjust the specific voltage value of the preset power supply signal using the power supply switching signal, so as to partially improve the problems that the signal amplification speed is slow and the circuit noise is high.

The above are merely the preferred embodiments of the present disclosure and are not intended to limit the scope of the present disclosure.

It should be noted that in the present disclosure, terms "include" and "contain" or any other variation thereof are intended to cover nonexclusive inclusions, so that a process, method, object or device including a series of elements not only includes those elements but also includes other elements which are not clearly listed or further includes elements intrinsic to the process, the method, the object or the device. Under the condition of no more limitations, an element defined by the statement "including a/an . . . " does not exclude existence of the same other elements in a process, method, object or device including the element.

The sequence numbers of the embodiments of the disclosure are adopted not to represent superiority-inferiority of the embodiments but only for description.

The methods disclosed in some method embodiments provided in the disclosure may be freely combined without conflicts to obtain new method embodiments.

The features disclosed in some product embodiments provided in the disclosure may be freely combined without conflicts to obtain new product embodiments.

The features disclosed in some method or device embodiments provided in the disclosure may be freely combined without conflicts to obtain new method embodiments or device embodiments.

The above is only the specific implementation of the disclosure and not intended to limit the scope of protection of the disclosure. Any variations or replacements apparent to those skilled in the art within the technical scope disclosed by the disclosure shall fall within the scope of protection of the disclosure. Therefore, the scope of protection of the disclosure shall be subject to the scope of protection of the claims.

The embodiments of the present disclosure provide a control amplifying circuit, a sense amplifier and a semiconductor memory. The control amplifying circuit includes a power supply output circuit, an isolation control circuit and an amplifying circuit. The power supply output circuit is configured to receive a power supply switching signal, and select one preset voltage value from at least two preset voltage values according to the power supply switching signal to output as a preset power supply signal. The isolation control circuit is configured to receive a control command signal and the preset power supply signal, and generate an isolation control signal according to the control command signal. The amplifying circuit is configured to receive the isolation control signal and a signal to be processed, and amplify the signal to be processed based on the isolation control signal to obtain a target amplified signal. In this way, a voltage value of the preset power supply signal can be adjusted by using the power supply switching signal, and then a voltage value of the isolation control circuit is adjusted, so as to optimize the signal amplification process and partially improve the problems that the signal amplification speed is slow and noise is easily generated.

What is claimed is:
1. A control amplifying circuit, comprising:
  a power supply output circuit, configured to receive a power supply switching signal, and select one of at least two preset voltage values according to the power supply switching signal to output as a preset power supply signal;

an isolation control circuit, configured to receive a control command signal and the preset power supply signal, and generate an isolation control signal according to the control command signal; and an amplifying circuit, configured to receive the isolation control signal and a signal to be processed, and amplify the signal to be processed based on the isolation control signal to obtain a target amplified signal.

2. The control amplifying circuit of claim 1, wherein the power supply switching signal comprises at least one of a first power supply switching signal or a second power supply switching signal, and the control amplifying circuit further comprises: a power supply switching circuit, configured to output at least one of the first power supply switching signal or the second power supply switching signal; and wherein the power supply output circuit is configured to receive at least one of the first power supply switching signal or the second power supply switching signal, and select one of the at least two preset voltage values according to at least one of the first power supply switching signal or the second power supply switching signal to output as the preset power supply signal.

3. The control amplifying circuit of claim 2, wherein the preset voltage values comprise a first voltage value and a second voltage value, and the power supply output circuit is further configured to:

select the first voltage value to output as the preset power supply signal when the first power supply switching signal is in a first level state and the second power supply switching signal is in a second level state; or select the second voltage value to output as the preset power supply signal when the first power supply switching signal is in the second level state and the second power supply switching signal is in the first level state;

wherein the first voltage value and the second voltage value both belong to the second level state, and the first voltage value is greater than the second voltage value.

4. The control amplifying circuit of claim 3, wherein the power supply output circuit comprises a first preset power supply, a second preset power supply, a first switching transistor and a second switching transistor; wherein a first end of the first switching transistor is connected with the first power supply switching signal, and a first end of the second switching transistor is connected with the second power supply switching signal;

a second end of the first switching transistor is connected with the first preset power supply, and a second end of the second switching transistor is connected with the second preset power supply; and a third end of the first switching transistor is connected with a third end of the second switching transistor for outputting the preset power supply signal;

wherein the first preset power supply is configured to output the first voltage value, and the second preset power supply is configured to output the second voltage value.

5. The control amplifying circuit of claim 4, wherein the first switching transistor, the second switching transistor, the third switching transistor, the seventh switching transistor and the eighth switching transistor are P-type channel field effect transistors; and the fourth switching transistor, the fifth switching transistor, the sixth switching transistor, the ninth switching transistor, the tenth switching transistor, the eleventh switching transistor, the twelfth switching transistor, the thirteenth switching transistor, the fourteenth switching transistor, the fifteenth switching transistor and the sixteenth switching transistor are N-type channel field effect transistors.

6. The control amplifying circuit of claim 1, further comprising: a signal control circuit; wherein the signal control circuit is configured to output the control command signal; and the isolation control circuit is further configured to generate an isolation control signal with a third voltage value when the control command signal is in a first state, or, generate an isolation control signal with a same voltage value as the preset power supply signal when the control command signal is in a second state;

wherein the first state is a first level state or a second level state, the second state is the first level state or the second level state, level states of the first state and the second state are different, and the third voltage value belongs to the first level state and is less than a second voltage value.

7. The control amplifying circuit of claim 1, wherein the amplifying circuit comprises a cross-coupled circuit and a control circuit; wherein the amplifying circuit is further configured to receive the signal to be processed through the cross-coupled circuit, receive the isolation control signal through the control circuit, and amplify the signal to be processed according to the isolation control signal to obtain the target amplified signal.

8. The control amplifying circuit of claim 7, wherein the cross-coupled circuit comprises a fifth switching transistor, a sixth switching transistor, a seventh switching transistor and an eighth switching transistor, and the control circuit comprises a ninth switching transistor and a tenth switching transistor; wherein a first end of the fifth switching transistor is connected with a third end of the ninth switching transistor for receiving the signal to be processed, and a second end of the fifth switching transistor, a third end of the seventh switching transistor and a first end of the eighth switching transistor are connected with a second end of the tenth switching transistor;

a first end of the sixth switching transistor is connected with a third end of the tenth switching transistor for receiving a reference signal to be processed, and a second end of the sixth switching transistor, a third end of the eighth switching transistor and a first end of the seventh switching transistor are connected with a second end of the ninth switching transistor;

a third end of the fifth switching transistor and a third end of the sixth switching transistor are connected with a first reference signal, a second end of the seventh switching transistor and a second end of the eighth switching transistor are connected with a second reference signal, and a first end of the ninth switching transistor and a first end of the tenth switching transistor are connected with the isolation control signal.

9. The control amplifying circuit of claim 8, wherein the amplifying circuit further comprises a first reference circuit and a second reference circuit; wherein the first reference circuit is configured to receive a first reference control signal and output the first reference signal according to the first reference control signal; and the second reference circuit is configured to receive a second reference control signal and output the second reference signal according to the second reference control signal;

wherein a voltage value of the first reference signal is a fourth voltage value or a fifth voltage value, a voltage value of the second reference signal is the fourth voltage value or a sixth voltage value, and the fourth voltage value is an intermediate value between the fifth voltage value and the sixth voltage value.

10. The control amplifying circuit of claim 9, wherein the first reference circuit comprises n eleventh switching transistors, n being a positive integer; wherein
   a first end of each eleventh switching transistor is connected with a respective one of first reference control signals, a third end of each eleventh switching transistor is connected with a ground signal; and
   a second end of each eleventh switching transistor is connected with an output end of the first reference circuit for outputting the first reference signal.

11. The control amplifying circuit of claim 10, wherein the second reference circuit comprises m twelfth switching transistors, m being a positive integer; wherein
   a first end of each twelfth switching transistor is connected with a respective one of second reference control signals, and a second end of each twelfth switching transistor is connected with a respective one of third preset power supplies; and
   the third end of each twelfth switching transistor is connected with an output end of the second reference circuit for outputting the second reference signal.

12. The control amplifying circuit of claim 11, wherein the amplifying circuit further comprises a first signal establishing circuit and a second signal establishing circuit; wherein
   the first signal establishing circuit is configured to receive a first control input signal and output the first reference control signal; and
   the second signal establishing circuit is configured to receive a second control input signal and output the second reference control signal.

13. The control amplifying circuit of claim 12, wherein the first signal establishing circuit comprises n second inverters, and the second signal establishing circuit comprises m third inverters; wherein
   an input end of each second inverter is connected with a respective one of first control input signals, and an output end of each second inverter is configured to output the respective one of first reference control signals; wherein a first reference control signal of each eleventh switching transistor is output through one of the n second inverters; and
   an input end of each third inverter is connected with the respective one of second control input signals, and an output end of each third inverter is configured to output the respective one of second reference control signals; wherein a second reference control signal of each twelfth switching transistor is output through one of the m third inverters.

14. The control amplifying circuit of claim 8, wherein the amplifying circuit further comprises a precharge circuit, and the precharge circuit comprises a thirteenth switching transistor and a fourteenth switching transistor; wherein
   a first end of the thirteenth switching transistor and a first end of the fourteenth switching transistor are connected with a precharge signal;

a second end of the thirteenth switching transistor is connected with a fourth preset power supply, and a third end of the thirteenth switching transistor is connected with the second end of the sixth switching transistor; and
   a third end of the fourteenth switching transistor is connected with the second end of the fifth switching transistor, and a second end of the fourteenth switching transistor is connected with the second end of the sixth switching transistor.

15. The control amplifying circuit of claim 8, wherein the amplifying circuit further comprises a noise cancellation circuit, and the noise cancellation circuit comprises a fifteenth switching transistor and a sixteenth switching transistor; wherein
   a first end of the fifteenth switching transistor and a first end of the sixteenth switching transistor are connected with a noise cancellation signal;
   a second end of the fifteenth switching transistor is connected with the second end of the fifth switching transistor, and a third end of the fifteenth switching transistor is connected with the first end of the fifth switching transistor; and
   a second end of the sixteenth switching transistor is connected with the second end of the sixth switching transistor, and a third end of the sixteenth switching transistor is connected with the first end of the sixth switching transistor.

16. The control amplifying circuit of claim 1, wherein the isolation control circuit comprises a first inverter, a third switching transistor and a fourth switching transistor; wherein
   an input end of the first inverter is connected with the control command signal, and an output end of the first inverter is respectively connected with a first end of the third switching transistor and a first end of the fourth switching transistor;
   a second end of the third switching transistor is connected with the preset power supply signal, and a third end of the fourth switching transistor is connected with a ground signal; and
   a third end of the third switching transistor is connected with a second end of the fourth switching transistor for outputting the isolation control signal.

17. A control method for an amplifying circuit, applied to an amplifying circuit connected with a target detection unit, the control method comprising:
   when the amplifying circuit is in a first amplification phase, selecting, by a power supply output circuit, a second voltage value to output as a preset power supply signal according to a power supply switching signal, generating, by an isolation control circuit, an isolation control signal with the second voltage value according to a control command signal in a second state, and receiving, by the amplifying circuit, the isolation control signal and a signal to be processed and performing preliminary amplification on the signal to be processed; and
   when the amplifying circuit is in an evolution phase, selecting, by the power supply output circuit, a first voltage value to output as the preset power supply signal according to the power supply switching signal, generating, by the isolation control circuit, an isolation control signal with the first voltage value according to the control command signal in the second state, and performing, by the amplifying circuit, secondary amplification on the signal to be processed according to the isolation control signal.

18. The control method of claim 17, wherein the amplifying circuit is further in a standby phase, a first charge sharing phase, a second charge sharing phase, and a precharge phase, and the method further comprising:
when the amplifying circuit is in the standby phase, the second charge sharing phase or the precharge phase, selecting, by the power supply output circuit, the second voltage value to output as the preset power supply signal according to the power supply switching signal, and generating, by the isolation control circuit, the isolation control signal with the second voltage value according to the control command signal in the second state; and
when the amplifying circuit is in the first charge sharing phase, selecting, by the power supply output circuit, the second voltage value to output as the preset power supply signal according to the power supply switching signal, generating, by the isolation control circuit, an isolation control signal with a third voltage value according to a control command signal in a first state, and receiving, by the amplifying circuit, the signal to be processed to perform first charge sharing.

19. A sense amplifier, comprising a control amplifying circuit, wherein the control amplifying circuit comprises:
a power supply output circuit, configured to receive a power supply switching signal, and select one of at least two preset voltage values according to the power supply switching signal to output as a preset power supply signal;
an isolation control circuit, configured to receive a control command signal and the preset power supply signal, and generate an isolation control signal according to the control command signal; and
an amplifying circuit, configured to receive the isolation control signal and a signal to be processed, and amplify the signal to be processed based on the isolation control signal to obtain a target amplified signal.

20. A semiconductor memory, comprising the sense amplifier of claim 19.

* * * * *